US012315572B2

(12) United States Patent
Chen et al.

(10) Patent No.: US 12,315,572 B2
(45) Date of Patent: May 27, 2025

(54) MANAGING MULTI-BLOCK OPERATIONS IN MEMORY DEVICES

(71) Applicant: Macronix International Co., Ltd., Hsinchu (TW)

(72) Inventors: Wei-Han Chen, Tainan (TW); Chun-Hsiung Hung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 292 days.

(21) Appl. No.: 17/981,919

(22) Filed: Nov. 7, 2022

(65) Prior Publication Data

US 2024/0153564 A1 May 9, 2024

(51) Int. Cl.
*G11C 16/24* (2006.01)
*G11C 16/04* (2006.01)
*G11C 16/26* (2006.01)

(52) U.S. Cl.
CPC .......... *G11C 16/24* (2013.01); *G11C 16/0483* (2013.01); *G11C 16/26* (2013.01)

(58) Field of Classification Search
CPC ...... G11C 16/0483; G11C 16/26; G11C 16/24
See application file for complete search history.

(56) References Cited

U.S. PATENT DOCUMENTS

| 9,455,011 | B2 | 9/2016 | Raychowdhury et al. |
| 10,074,422 | B1 | 9/2018 | Tandingan et al. |
| 2009/0052254 | A1* | 2/2009 | Hosono ............... G11C 16/10 365/189.05 |
| 2016/0099070 | A1 | 4/2016 | Jiang et al. |

FOREIGN PATENT DOCUMENTS

| CN | 106688043 A | 5/2017 |
| CN | 107978330 A | 5/2018 |
| TW | I459387 B | 11/2014 |

* cited by examiner

*Primary Examiner* — Alfredo Bermudez Lozada
(74) *Attorney, Agent, or Firm* — Fish & Richardson P.C.

(57) ABSTRACT

Systems, methods, circuits, and apparatus for managing multi-block operations in memory devices are provided. In one aspect, a memory device includes a memory cell array including at least two blocks, a bit line coupled to a string of memory cells in each of the at least two blocks respectively, a common source line (CSL) coupled to strings coupled to the bit line in the at least two blocks, and a circuitry configured to perform a multi-block operation in the memory cell array by at least one of: forming a first current path from the bit line through the strings to the CSL coupled to a ground to discharge a capacitor associated with the bit line that is pre-charged, or forming a second current path from the CSL coupled to a supply voltage through the strings to the bit line to charge the capacitor that is pre-discharged.

19 Claims, 17 Drawing Sheets

MANAGING MULTI-BLOCK OPERATIONS IN MEMORY DEVICES

BACKGROUND

Once memory cells in a memory device are programmed, data can be read from the memory cells by sensing a programmed state of each memory cell by comparing a cell current to one or more read reference currents. A multi-block read operation can be performed for computing-in-memory (CIM) (or in-memory-computing (IMC)) or in-memory-searching (IMS). However, the read operation can cause a large constant current during the read progress, which can be a tough issue for a power system.

SUMMARY

The present disclosure describes methods, devices, systems, and techniques for managing multi-block operations in memory devices, e.g., by using forward voltage read and/or reverse voltage read for power saving in multi-block operations in computing-in-memory (CIM) type non-volatile memory chips or in-memory-searching (IMS) type memory chips.

One aspect of the present disclosure features a memory device including: a memory cell array including at least two blocks each having a plurality of memory cells; a bit line, each of the at least two blocks including a string of memory cells coupled to the bit line; and a circuitry coupled to the memory cell array and the bit line. The circuitry is configured to: turn on a charging path to charge a capacitor associated with the bit line while strings coupled to the bit line in the at least two blocks are off, turn off the charging path and turn on the strings coupled to the bit line to discharge the capacitor, and sense voltage threshold levels of memory cells in the strings of the at least two blocks by detecting a voltage level of the discharged capacitor, with the strings being on and the charging path being off.

In some embodiments, the circuitry is configured to detect the voltage level of the discharged capacitor by conductively connecting the capacitor to a sensing capacitor coupled to at least one latch circuit. The sensing capacitor can include at least one of: a transistor capacitor, or a parasitic capacitor associated with the at least one latch circuit.

In some embodiments, the sensing capacitor is configured to be precharged to a first voltage level before the capacitor is conductively connected to the sensing capacitor. The sensing capacitor is configured to: keep at the first voltage level if the voltage threshold levels of the memory cells in the strings of the at least two blocks are at a higher level, and decrease to a second voltage level if a voltage threshold level of memory cells in at least one of the strings of the at least two blocks is at a lower level, the second voltage level being lower than the first voltage level. The sensing capacitor can be configured to be precharged while the capacitor is discharged with the strings being on and the charging path being off.

In some embodiments, a capacitance of the capacitor is substantially greater than a capacitance of the sensing capacitor, such that a voltage level of the sensing capacitor becomes corresponding to the voltage level of the discharged capacitor when the capacitor is conductively connected to the sensing capacitor.

In some embodiments, the circuitry includes: a control circuit having a first end coupled to a supply voltage and a second end coupled to the bit line, a precharging circuit having a third end coupled to the supply voltage and a fourth end coupled to the sensing capacitor, and a switch transistor coupled between the bit line and the precharging circuit. The capacitor can be charged through the charging path by turning on the control circuit to conductively connect the supply voltage to the bit line. The sensing capacitor can be precharged by turning on the precharging circuit to conductively connect the supply voltage to the sensing capacitor, with the switch transistor being turned off. The switch transistor can be configured to be turned on to conductively connect the capacitor to the sensing capacitor.

In some embodiments, the control circuit includes: a first transistor coupled between the switch transistor and the bit line, and a second transistor coupled between the supply voltage and the first transistor. The first transistor and the second transistor can be configured to be turned on to charge the capacitor in a first phase and to be turned off while the capacitor is discharged in a second phase sequential to the first phase. The first transistor and the switch transistor can be configured to be turned on to conductively connect the capacitor to the sensing capacitor to detect the voltage level of the discharged capacitor in a third phase sequential to the second phase, and where the second transistor is configured to be turned off in the third phase.

In some embodiments, the circuitry includes: a precharging circuit having a first end coupled to a supply voltage and a second end coupled to the sensing capacitor, and a switch transistor coupled between the bit line and the precharging circuit. The sensing capacitor is precharged by turning on the precharging circuit to conductively connect the supply voltage to the sensing capacitor, with the switch transistor being turned off. The switch transistor and the precharging circuit are configured to be turned on to charge the capacitor in a first phase, and the switch transistor is turned off while the capacitor is discharged and the sensing capacitor keeps being charged by the precharging circuit in a second phase sequential to the first phase. The switch transistor is configured to be turned on to conductively connect the capacitor to the sensing capacitor to detect the voltage level of the discharged capacitor in a third phase sequential to the second phase.

In some embodiments, during the first phase, a first control signal for the first transistor has a lower voltage level than a second control signal for the second transistor, and during the third phase, the first control signal for the first transistor has a lower voltage level than a third control signal for the third transistor.

In some embodiments, the capacitor includes a parasitic capacitor formed between the bit line and at least one adjacent bit line.

In some embodiments, the strings of the at least two blocks are configured to be turned on by applying a read voltage to at least one selected memory cell in the strings.

In some embodiments, the circuitry is configured to: in response to receiving a command to perform a multi-block operation in the memory cell array, turn on the charging path to charge the capacitor associated with the bit line. The multi-block operation can include a computer-in-memory (CIM) operation or an in-computer-searching (IMS) operation.

In some embodiments, the strings are conductively coupled to a common source line (CSL) that is conductively coupled to a ground while the strings are turned on.

In some embodiments, the memory device includes a plurality of bit lines including the bit line. The memory cell array includes a plurality of groups of blocks, and for each group of the plurality of groups, blocks in the group are coupled to a respective bit line of the plurality of bit lines, and the respective bit line is conductively coupled to a respective string of memory cells in each of the blocks in the group.

Another aspect of the present disclosure features a memory device including: a memory cell array including at least two blocks each having a plurality of memory cells; a bit line, each of the at least two blocks including a string of memory cells coupled to the bit line; a common source line (CSL) conductively coupled to strings coupled to the bit line in the at least two blocks; and circuitry coupled to the bit line and the CSL and configured to: turn off the strings coupled to the bit line and discharge a capacitor associated with the bit line to a first voltage level, conductively connect the CSL to a supply voltage such that the CSL is charged to be at a second voltage level that is higher than the first voltage level, turn on the strings to conductively connect the CSL to the bit line to charge the capacitor, and sense voltage threshold levels of memory cells in the strings of the at least two blocks by detecting a voltage level of the charged capacitor, with the strings being on and the CSL being at the second voltage level.

In some embodiments, the circuitry is configured to detect the voltage level of the charged capacitor by conductively connecting the capacitor to a sensing capacitor coupled to at least one latch circuit.

In some embodiments, the sensing capacitor is configured to be precharged to a third voltage level before the capacitor is conductively connected to the sensing capacitor, the third voltage level being higher than the first voltage level. The sensing capacitor can be configured to: keep at the third voltage level if a voltage threshold level of memory cells in at least one of the strings of the at least two blocks is at a lower level, and decrease to a fourth voltage level if the voltage threshold levels of the memory cells in the strings of the at least two blocks is at a higher level, the fourth voltage level being lower than the third voltage level.

In some embodiments, the sensing capacitor is configured to be precharged while the capacitor is charged with the strings being on and the CSL being at the second voltage level. In some embodiments, the sensing capacitor includes at least one of: a transistor capacitor, or a parasitic capacitor associated with the at least one latch circuit.

In some embodiments, a capacitance of the capacitor is substantially larger than a capacitance of the sensing capacitor, such that a voltage level of the sensing capacitor becomes corresponding to the voltage level of the charged capacitor after the capacitor is conductively connected to the sensing capacitor.

In some embodiments, the circuitry includes: a discharging circuit having a first end coupled to a ground and a second end coupled to the bit line, a precharging circuit having a third end coupled to the supply voltage and a fourth end coupled to the sensing capacitor, and a switch transistor coupled between the bit line and the precharging circuit. The capacitor can be discharged by turning on the discharging circuit to conductively connect the bit line to the ground. The sensing capacitor can be precharged by turning on the precharging circuit to conductively connect the supply voltage to the sensing capacitor, with the switch transistor being off. The switch transistor can be configured to be turned on to conductively connect the capacitor to the sensing capacitor.

In some embodiments, the circuitry includes a control transistor having a first terminal coupled to the supply voltage and a second terminal coupled to the CSL, and the control transistor is configured to be turned on to conductively connect the CSL to the supply voltage.

In some embodiments, the capacitor can include a parasitic capacitor formed between the bit line and at least one adjacent bit line. In some embodiments, the strings of the at least two blocks are configured to be turned on by applying a read voltage to at least one selected memory cell in the strings.

In some embodiments, the circuitry is configured to: in response to receiving a command to perform a multi-block operation in the memory cell array, conductively connect the CSL to the supply voltage and turn on the strings coupled to the bit line to conductively connect the CSL to the bit line to charge the capacitor.

A further aspect of the present disclosure features a memory device including: a memory cell array including at least two blocks each having a plurality of memory cells; a bit line, each of the at least two blocks comprises a string of memory cells coupled to the bit line; a common source line (CSL) coupled to strings coupled to the bit line in the at least two blocks; and a circuitry coupled to the memory cell array, the bit line, and the CSL. The circuitry is configured to perform a multi-block operation in the memory cell array by at least one of: forming a first current path (e.g., a forward current path) from the bit line through the strings of the at least two blocks to the CSL coupled to a ground to discharge a capacitor associated with the bit line that is pre-charged, or forming a second current path (e.g., a reverse current path) from the CSL coupled to a supply voltage through the strings of the at least two blocks to the bit line to charge the capacitor that is pre-discharged.

In some embodiments, the circuitry is configured to: in response to determining that a command indicates to perform the multi-block operation using a first voltage read (e.g., a forward voltage read), form the first current path, and in response to determining that a command indicates to perform the multi-block operation using a second voltage read (e.g., a reverse voltage read), form the second current path.

In some embodiments, the circuitry includes at least one of: a control circuit having a first end coupled to the supply voltage and a second end coupled to the bit line, the control circuit being configured to pre-charge the capacitor before the forward current path is formed, or a discharging circuit having a first end coupled to the ground and a second end coupled to the bit line, the discharging circuit being configured to pre-discharge the capacitor before the reverse current path is formed.

In some embodiments, the circuitry is configured to: sense voltage threshold levels of memory cells in the strings of the at least two blocks by conductively connecting the capacitor to a sensing capacitor that is coupled to at least one latch circuit.

In some embodiments, the circuitry further includes: a precharging circuit having a first end coupled to the supply voltage and a second end coupled to the sensing capacitor, the precharging circuit being configured to pre-charge the sensing capacitor before conductively connecting the capacitor to the sensing capacitor, and a switch transistor coupled between the bit line and the precharging circuit and configured to be turned on to conductively connect the capacitor to the sensing capacitor.

In the present disclosure, the term "multiple" means "at least two" or "more than one." The terms "multiple" and "at least two" can be used interchangeably herein. The term "multi-block operation" means an operation involving multiple blocks or at least two blocks.

Implementations of the above techniques include methods, systems, circuits, computer program products and computer-readable media. In one example, a method can be performed in a memory device and the method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Overview

Figure 1A:
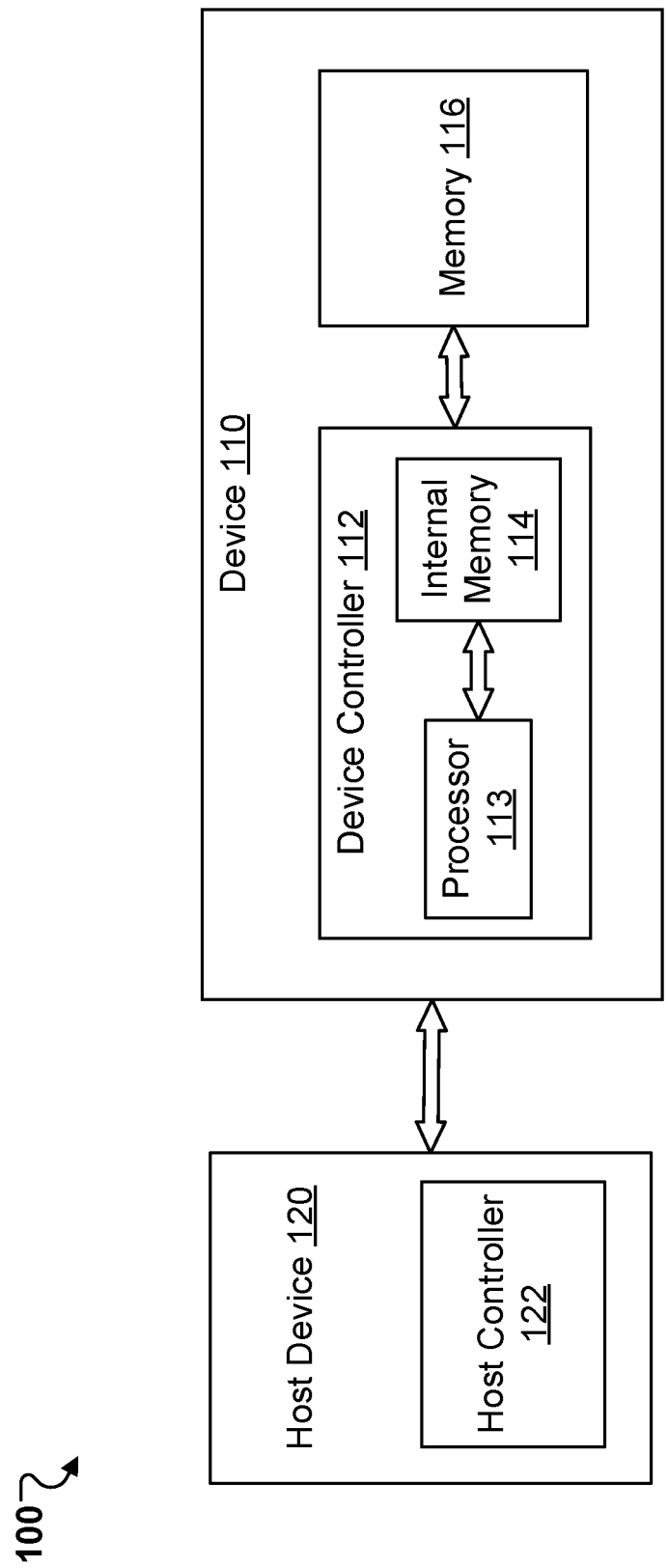
FIG. 1A illustrates an example of a system including a memory, according to one or more implementations of the present disclosure.

Implementations of the present disclosure provide techniques for managing multi-block operations in memory devices, e.g., operations on page buffers and strings in CIM (or IMC) type memory devices or IMS type memory devices. The techniques can address large currents caused during a multi-block read operation, e.g., by using forward voltage read or reverse voltage read to limit current consumption on charging bit line (BL) capacitors, which can avoid constant current consumption in the multi-block operation and reduce pressure on a corresponding power system, bit lines, and/or circuits.

In some implementations, forward voltage read is applied in a multi-block operation in a memory device, e.g., by dividing the progress of charging and development on a bit line coupled to multiple blocks in the memory device. In a charging phase, a maximum charge that a power system needs to provide is for a bit line (BL) capacitor (e.g., a parasitic capacitor formed by adjacent bit lines). In a sensing phase, there is no current path from any power, except charge sharing between a sensing capacitor and the BL capacitor. In some embodiments, whether forward voltage read is performed can be detected by checking whether a control circuit or a switch transistor used to charge the bit line capacitor is turned off in the sensing phase. If the control circuit or the switch transistor is turned off during the sensing phase, it can indicate the forward voltage read is performed for the read operation.

In some implementations, reverse voltage read is applied in a multi-block operation in a memory device. In an initial phase, a capacitor associated with a bit line coupled to strings of multiple blocks of the memory device is discharged. Then in a charging phase, the capacitor is charged by a reverse current from a common source line (CSL) coupled to a supply voltage through the multiple strings to the bit line. If all word lines in the multiple blocks (including a target word line) is at a high threshold voltage, the capacitor is not charged and remains at a low voltage level. If at least one word line (e.g., the target word line) is at a low threshold voltage, the capacitor is charged to a high voltage level. In a sensing phase, a sensing node associated with a pre-charged sensing capacitor becomes a high voltage level due to charge sharing between the sensing capacitor and the capacitor. In some embodiments, whether a memory device uses reverse read can be detected by probing the CSL voltage. If the CSL voltage is high, the reverse read may be performed in the memory device.

In some implementations, the charging progress can be applied by other current paths as long as the target is to charge the bit line into a certain level and limit a bit line consumption power. Besides managing multi-block operations, the techniques can be also applied to any other suitable applications, e.g., for any memory operations involving power saving progress by storing charges on capacitors to limit maximum power consumption, or for any memory operation involving information indicating an access rate of block(s). For example, the forward voltage read and/or the reverse voltage read can be utilized for any multi-block applications such as computing-in-memory (CIM) or in-memory-searching (IMS). The dividing charging and sensing timing can be utilized to save power for any flash memory reading progress.

The techniques can be applied to various types of volatile memory or non-volatile memory, such as NAND flash memory, NOR flash memory, resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory, e.g., silicon-oxide-nitride-oxide-silicon (SONOS) memory, and floating-gate based memory. The techniques can be applied to two-dimensional (2D) memory or three-dimensional (3D) memory. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others.

Example Systems and Memory Devices

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory, or some other suitable non-volatile memory. In implementations where the memory 116 is NAND flash memory, the device 110 is a flash memory, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

In some implementations, the device controller 112 is configured to receive data and instructions from and to send data to the host device 120. The device controller 112 is further configured to send data and commands to the memory 116 and to receive data from the memory 116. For example, the device controller 112 is configured to send data and a write command to instruct the memory 116 to store the data to a specified address. As another example, the device controller 112 is configured to receive a read request (or a read command) from the host device 120 and send a corresponding read command to the memory 116 to read data from a specified address in the memory 116.

The memory 116 includes a plurality of blocks. The memory 116 can be a two-dimensional (2D) memory including 2D memory blocks, e.g., as illustrated with further details in FIG. 1B. The memory 116 can also be a three-dimensional (3D) memory including 3D memory blocks, e.g., as illustrated with further details in FIG. 1C. Each block can include a same number of pages. Each page has a unique number in the block. Data is stored in the pages of the block according to the order of the unique numbers of the pages in the block. Each page can be read or written separately, and pages in a block can be erased together.

In some implementations, a block can be divided into a number of sub-blocks. Each sub-block can include one or more pages. Each page in a sub-block can be read or written separately. The one or more pages in each sub-block can be erased together. In some implementations, the memory 116 includes one or more dies. Each die can be a memory chip and include a number of memory arrays and peripheral circuitry thereon. A memory array can include a number of planes, with each plane including a number of physical blocks of memory cells. Each physical block can include a number of pages of memory cells that can store a number of sectors of data. A super block can be specified, e.g., by a memory controller such as the controller 112 of FIG. TA, to combine at least one physical block from different planes. Each physical block in the super block comes from a different plane, that is, any plane cannot provide more than one block in the super block. The super block includes a number of super pages each combining multiple pages from the corresponding multiple physical blocks in the super block. Each page in a super page can have a same page number in its corresponding physical block. A super page can be programmed with all the pages in the super page being programmed simultaneously.

A memory cell can represent a number of states including an erased state and one or more programmed states. For example, in some cases, the memory cell is a single-level cell (SLC) that can store 1 bit and represent 2 states including an erased state (ER) and a programmed state (A). Memory cells in one word line can form one page. In some cases, the memory cell is a multi-level cell (MLC) such as a 2-level cell that can store 2 bits and represent 4 states including an erased state (ER) and three programmed states (A, B, and C). Memory cells in one word line can form two pages. In some cases, the memory cell is a triple-level cell (TLC) that can store 3 bits and represent 8 states including an erased state (ER) and seven programmed states (A, B, C, D, E, F, and G). Memory cells in one word line can form three pages. The states can have progressively higher voltage ranges, and the erased state has the lowest voltage rage.

Figure 1B:
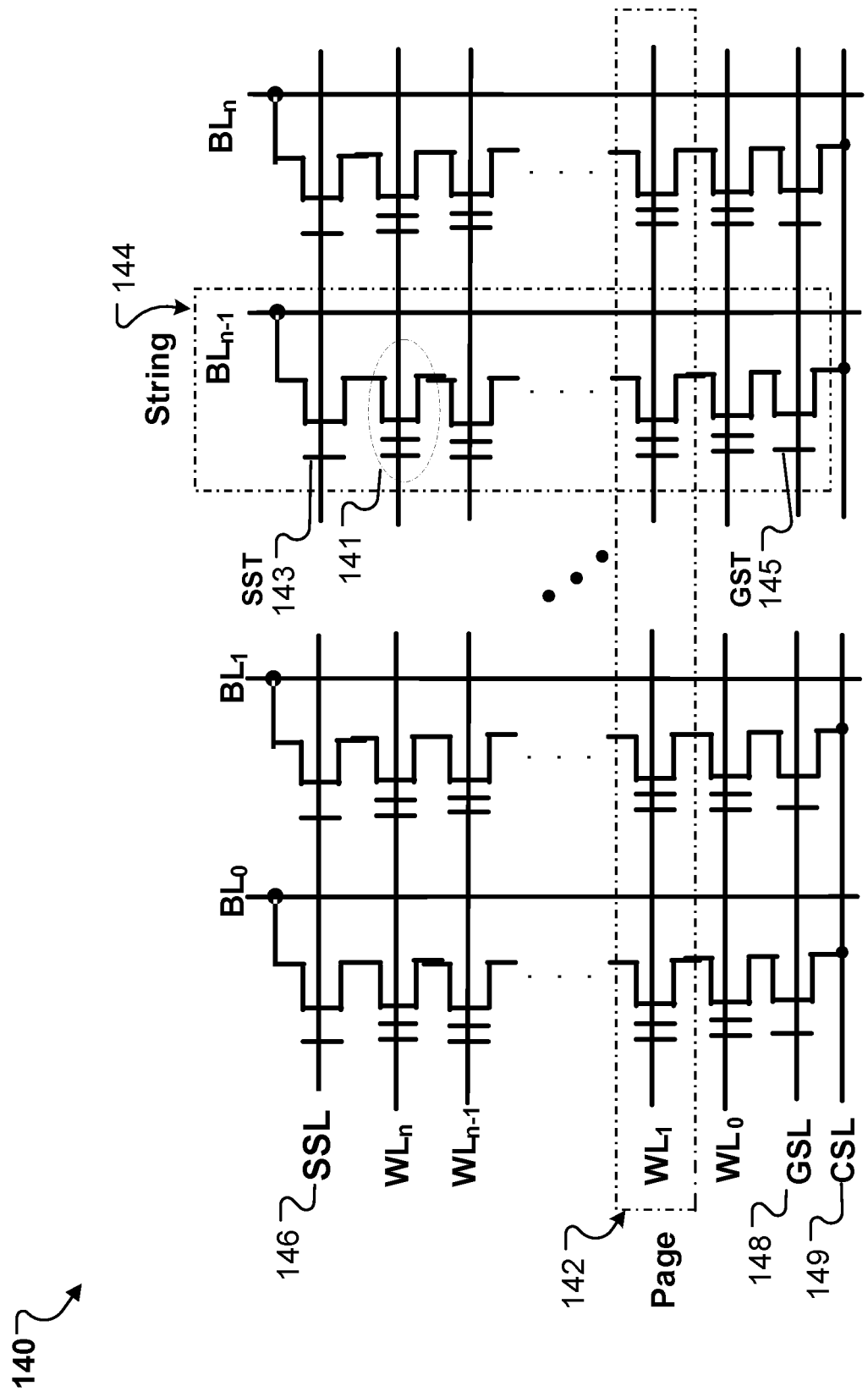
FIG. 1B illustrates an example block of a two-dimensional (2D) memory, according to one or more implementations of the present disclosure.

FIG. 1B illustrates an example configuration of a 2D memory block 140 when the memory 116 is a 2D memory. The block 140 includes memory cells 141 coupled in series to column bit lines $BL_0, BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0, WL_1, \ldots, WL_{n-1}, WL_n$. The cell strings 144 or the memory cells 141 are connected to a common source line (CSL) 149 via the GST 145. The CSL 149 can be coupled to a ground or a supply voltage. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower read voltage is applied onto a word line corresponding to the particular cell page 142. Meanwhile, a higher read voltage is applied onto the other cell pages in the block 140.

Figure 1C:
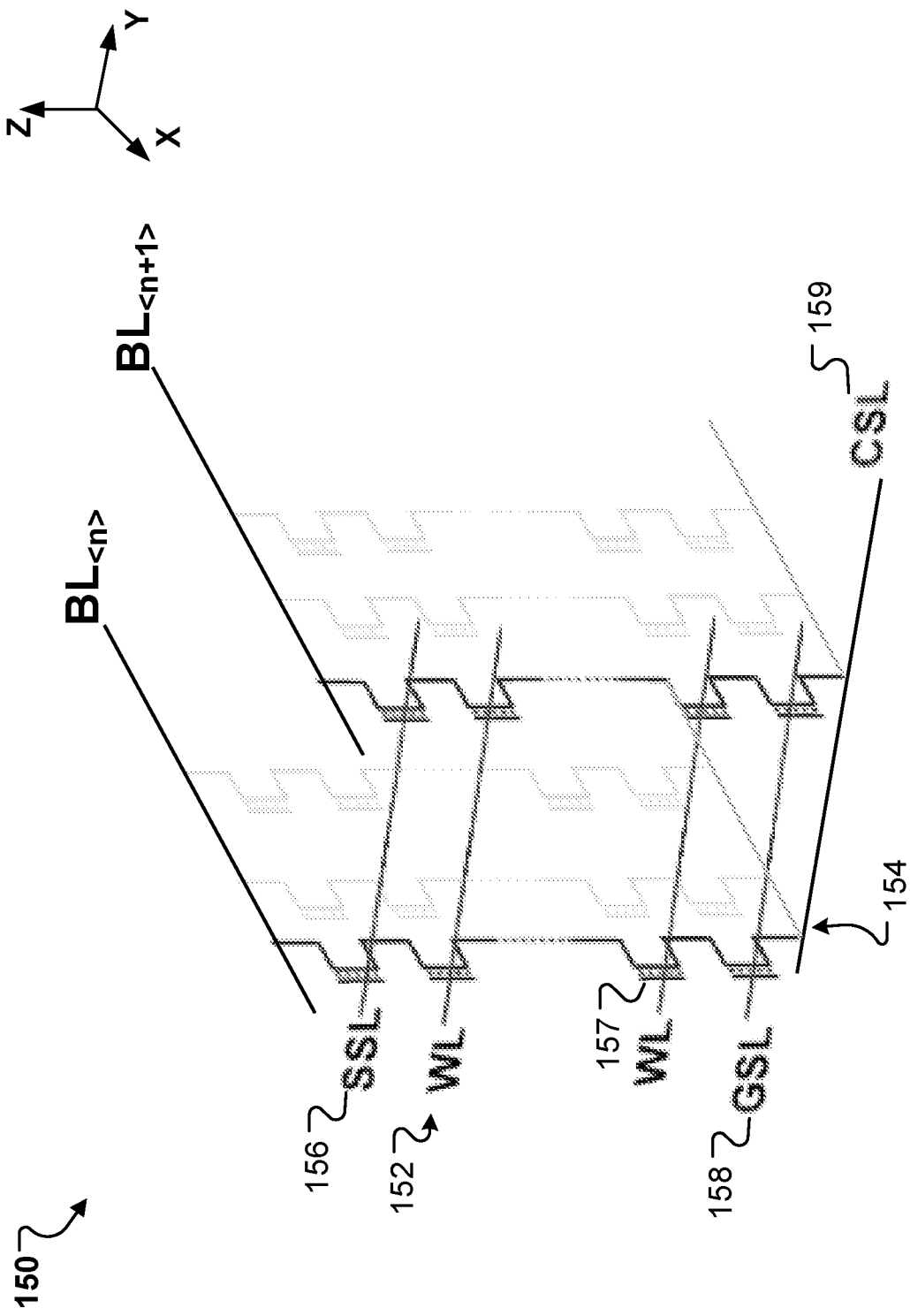
FIG. 1C illustrates an example block of a three-dimensional (3D) memory, according to one or more implementations of the present disclosure.

FIG. 1C illustrates an example 3D memory block 150 when the memory 116 (shown in FIG. 1A) is a 3D memory. The 3D memory block 150 can include a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines (e.g., $BL_{<n>}, BL_{<n+1>}$) to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground or a supply voltage.

Figure 2:
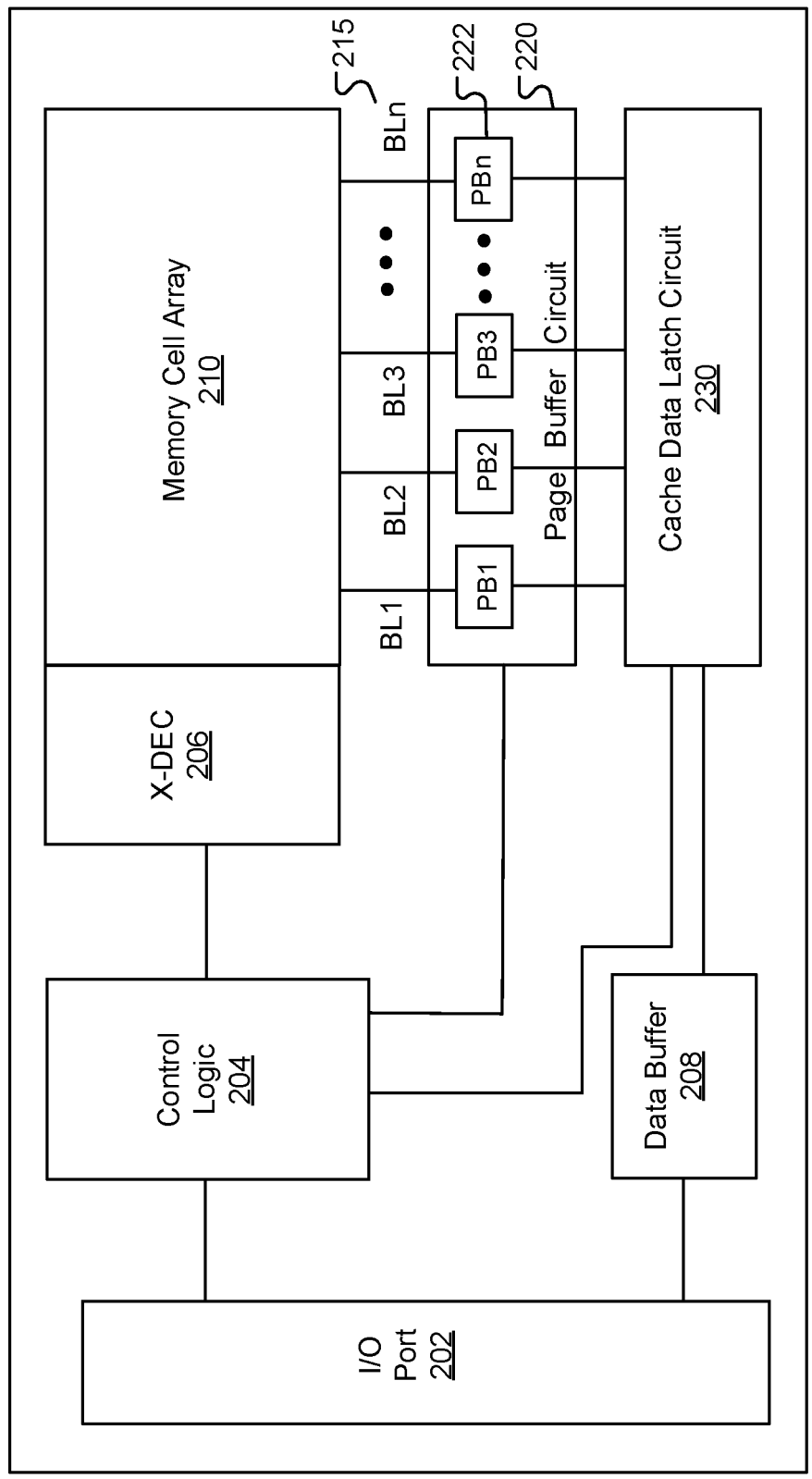
FIG. 2 illustrates an example memory device, according to one or more implementations of the present disclosure.

FIG. 2 illustrates an example configuration of a memory device 200. The memory device 200 can be implemented as the memory 116 of FIG. 1A. The memory device 200 includes a memory cell array 210. The memory cell array 210 can include a number of memory cells, e.g., the memory cells 141 of FIG. 1B or the memory cells 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory metal-oxide-silicon (MOS) device that can store charges.

The memory device 200 includes a memory interface 202 having multiple input/output (I/O) ports for receiving data, e.g., from a controller such as the device controller 112 of FIG. 1A or the host controller 122 of FIG. 1A, or outputting data from the memory cell array 210. The memory device 200 includes a data buffer 208 configured to buffer data received and outputted through the memory interface 202.

The memory device 200 further includes an X-decoder (or row decoder) 206 and an optional Y-decoder (not shown). Each memory cell is coupled to the X-decoder 206 via a respective word line and coupled to the Y-decoder via a respective bit line 215 (BL1, BL2, ..., BLn). Accordingly, each memory cell can be selected by the X-decoder 206 and the Y-decoder for read or write operations through the respective word line and the respective bit line 215.

The memory device 200 includes a page buffer circuit 220 that includes a number of page buffers 222. Each page buffer 222 (PB1, PB2, PB3, ..., PBn) is connected to the memory cell array 210 through a respective bit line 215 (BL1, BL2, BL3, ..., BLn). In some embodiments, a page buffer 222 is connected to the Y-decoder through a data line associated with a corresponding bit line 215 that connects a corresponding line of memory cells in the memory cell array 210. A page buffer is configured to control a voltage on a corresponding bit line to perform an operation, e.g., read, program, or erase, on a memory cell coupled to the corresponding bit line. A page buffer can include at least one latch circuit.

In some embodiments, the memory device 200 further includes a cache data latch (CDL) circuit 230 coupled between the page buffer circuit 220 and the data buffer 208. During a program or erase operation, the CDL circuit 230 is configured to store data from the data buffer 208 and/or output to one or more page buffers 222 in the page buffer circuit 220. During a read operation, the CDL circuit 230 is configured to store data from one or more page buffers 222 in the page buffer circuit 220 and/or output data to the data buffer 208.

The memory device 200 further includes a control logic 204 coupled to components in the memory device 200 including the X-decoder 206 and the Y-decoder, the data buffer 208, the page buffer circuit 220, and the CDL circuit 230. The control logic 204 is configured to receive a command, address information, and/or data, e.g., from a memory controller such as the device controller 112 of FIG. 1A, via the memory interface 202. The control logic 204 can also process the command, the address information, and/or the data, for example, to generate physical address information, e.g., of blocks/pages, in the memory cell array 210. The control logic 204 can include circuitry, e.g., an integrated circuit integrating multiple logics, circuits, and/or components.

In some implementations, the control logic 204 includes a data register, an SRAM buffer, an address generator, a mode logic, and a state machine. The mode logic can be configured to determine whether there is a read or write operation and provide a result of the determination to the state machine.

During a write operation, the data register in the control logic 204 can register input data from the interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer 222 can sense a small power signal (e.g., a current signal) that represents a data bit ("1" or "0") stored in the selected memory cell through a bit line 215 coupled to the page buffer 222 and the selected memory cell. A sense amplifier can amplify the small power signal swing to recognizable logic levels so the data bit can be interpreted properly by logic inside or outside the memory device 200. In some implementations, the page buffer circuit 220 and/or the CDL circuit 230 are included in the sense amplifier. The data buffer 208 can receive the amplified voltage from the sensor amplifier and output the amplified power signal to the logic outside the memory device 200 through the memory interface 202.

To sense data stored in a memory cell by sensing a current through a corresponding bit line, a page buffer can have a sensing capacitor on a sensing node for precharging and discharging at the sensing node. During a precharging phase of the page buffer, the sensing capacitor on the sensing node is precharged to have a predetermined sensing voltage. Then during a discharging phase following the precharging phase, charges stored in the sensing capacitor is discharged by a sensing current flowing to the memory cell via a corresponding bit line. Bit values latches in one or more latches in the page buffer can be updated based on a discharged sensing voltage $V_{SEN}$ at the sensing node.

During a sensing phase (or a strobing phase) following the discharging phase, if the memory cell stores a bit "0", the discharged sensing voltage $V_{SEN}$ at the sensing node can be greater than a predetermined threshold voltage $V_{Th}$, e.g., a strobe voltage $V_{Strobe}$ associated with latches in the page buffer. Accordingly, the page buffer can be configured to update a bit value "1" latched in the one or more latches to sensing value "0" or to strobe the sensing value "0" to the one or more latches. In contrast, if the memory cell stores a bit "1", the discharged sensing voltage $V_{SEN}$ at the sensing node can be smaller than or equal to the predetermined threshold voltage $V_{Th}$. Accordingly, the page buffer can be configured to maintain (or keep) the bit value "1" latches in the one or more latch circuits.

In some embodiments, the memory device 200 is configured to be a computing-in-memory (CIM) type non-volatile memory device or an in-memory-searching (IMS) type memory device. The memory device 200 can perform a multi-block operation in response to receiving a command for CIM or IMS operation. The multi-block operation can include simultaneously searching specific data in multiple blocks coupled to a bit line, e.g., by forward voltage read as described with further details in FIGS. 3A-3C and/or by reverse voltage read as described with further details in FIGS. 4A-4C. In some embodiments, for the multi-block operation, the simultaneously searching of the multiple blocks can be a coarse search, which can be followed with a fine search within the multiple blocks.

Example Forward Voltage Read

Figure 3A:
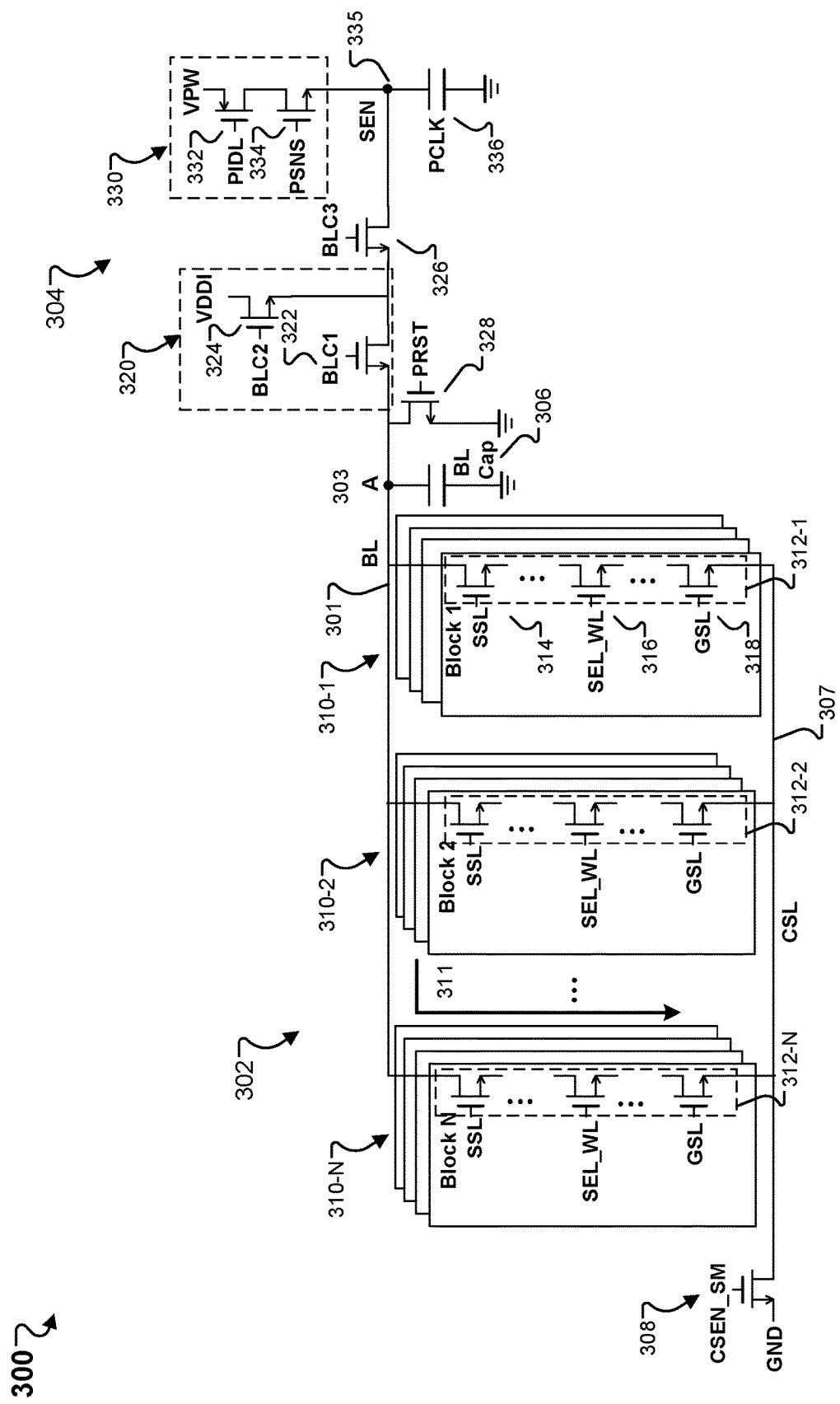
FIG. 3A is a schematic diagram illustrating an example of a memory device for performing a multi-block operation using forward voltage read in the memory device, according to one or more implementations of the present disclosure.

FIG. 3A is a schematic diagram illustrating an example of a memory device 300 for performing a multi-block operation using forward voltage read in the memory device 300, according to one or more implementations of the present disclosure. The memory device 300 can be the memory 116 of FIG. 1A or the memory device 200 of FIG. 2.

The memory device 300 includes a memory cell array 302 (e.g., the memory cell array 210 of FIG. 2). The memory cell array 302 can include a plurality of blocks (e.g., the block 140 of FIG. 1B or the block 150 of FIG. 1C) coupled to a plurality of bit lines (e.g., the bit line $BL_0$, $BL_1$, ..., $BL_{n-1}$, and $BL_n$ of FIG. 1B or $BL_{<n>}$ and $BL_{<n+1>}$ of FIG. 1C). Each bit line can be coupled to a respective group of multiple blocks. As illustrated in FIG. 3A, a bit line (BL) 301 is coupled to a respective string 312-1, 312-2, ..., 312-N (referred to generally as strings 312 and individually as string 312) in each of N blocks 310-1, 310-2, ..., 310-N (referred to generally as blocks 310 and individually as block 310).

A string 312 can be the cell string 144 of FIG. 1B or the cell string 154 of FIG. 1C. As illustrated in FIG. 3A, the string 312 can include a number of memory cells 316 (e.g., the memory cells 141 of FIG. 1B or 157 of FIG. 1C), a string select transistor (SST) 314 (e.g., SST 143 of FIG. 1B or SST of FIG. 1C), and a ground select transistor (GST) 318 (e.g., GST 145 of FIG. 1B or GST of FIG. 1C), which are all connected in series. The SST 314 is coupled to a string select line (SSL) (e.g., SSL 146 of FIG. 1B or SSL 156 of FIG. 1C), and the GST 318 is coupled to a ground select line (GSL) (e.g., GSL 148 of FIG. 1B or GSL 158 of FIG. 1C). Gates of the memory cells 316 are respectively connected to word lines $WL_0$, $WL_1$, ..., $WL_{n-1}$, $WL_n$. A memory cell can be individually selected by a bit line and a word line (e.g., a selected word line SEL_WL). The strings 312 in the multiple blocks 310 are connected to a common source line (CSL) 307 (e.g., the CSL 149 of FIG. 1B or the CSL 159 of FIG. 1C) via the GSTs 318.

The CSL 307 can be coupled to aground (GND) through a control transistor 308. The control transistor 308 can include a first terminal coupled to the CSL 307 and a second terminal coupled to the ground, and a gate node coupled to a control signal CSEN_SM. The control transistor 308 can be an n-channel transistor, e.g., NMOS transistor. The control transistor 308 can be configured to be turned on or off by the control signal CSEN_SM. For example, when the control signal CSEM_SM is at a high voltage level, the control transistor 308 is turned on and the CSL 307 is conductively coupled to the ground; when the control signal CSEM_SM is at a low voltage level, the control transistor 308 is turned off and the CSL 307 is not conductively coupled to the ground.

As illustrated in FIG. 3A, a bit line capacitor 306 is coupled between the bit line 301 at node A 303 and a ground (GND). The bit line capacitor 306 can be an equivalent capacitor that can include a parasitic capacitor formed between the bit line 301 and at least one adjacent bit line in the memory device 300. In some embodiments, the bit line capacitor 306 includes, besides the parasitic capacitor, a physical capacitor that can be made of a transistor, e.g., an MOS transistor.

As described with further details below, the memory device 300 includes a circuitry 304 coupled to the memory cell array 302 and the bit line 301. The circuitry 304 is configured to perform a multi-block operation on the memory cell array 302 based on the bit line capacitor 306, e.g., by forming a forward current path 311 from the bit line 301 through the strings 312 of the multiple blocks 310 to the CSL 307 coupled to the ground (GND) to discharge the bit line capacitor 306 that is pre-charged.

Figure 3B:
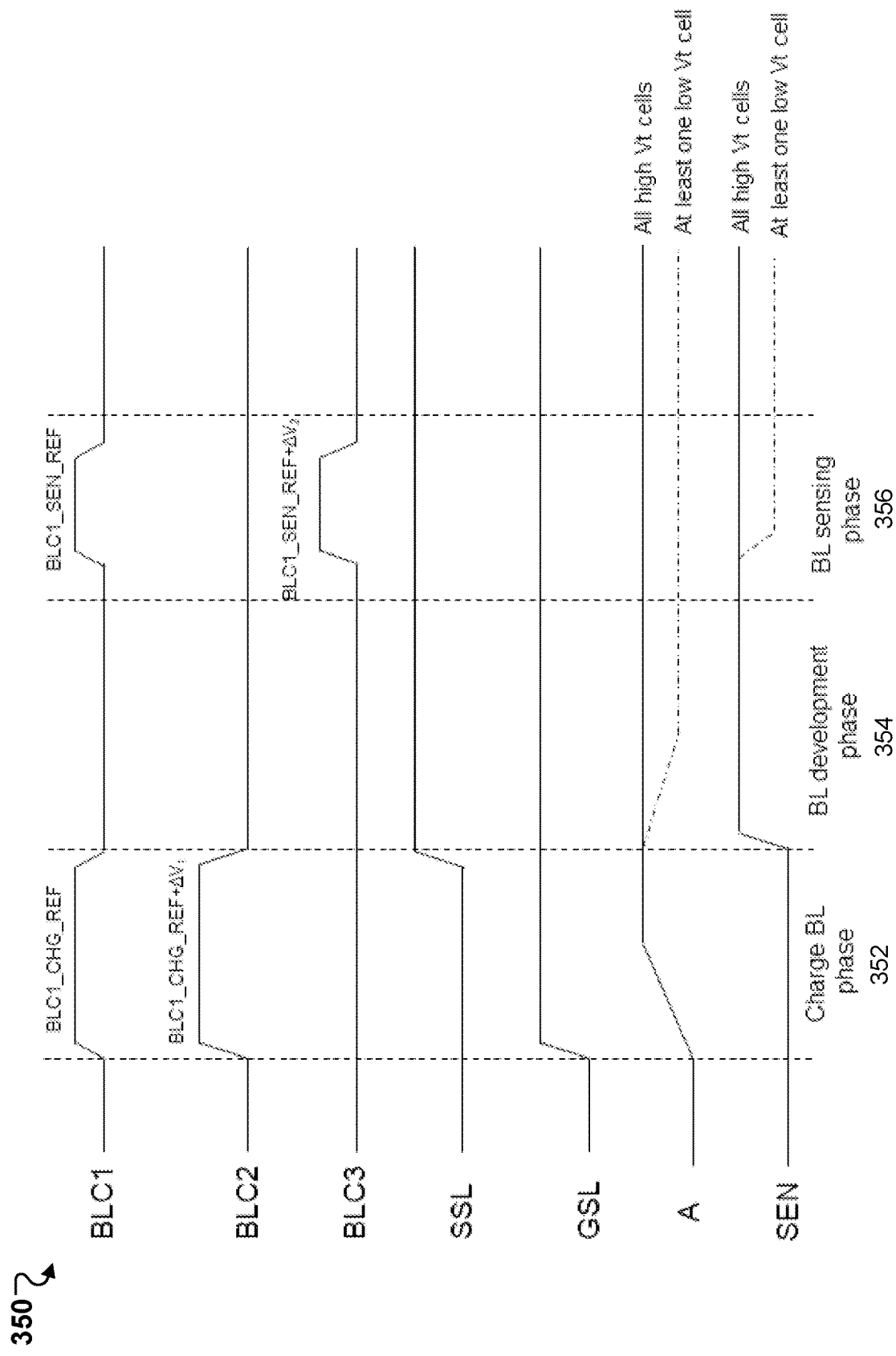
FIG. 3B shows a timing diagram illustrating voltage level changes at different nodes of the memory device of FIG. 3A during a series of operation phases, according to one or more implementations of the present disclosure.

In some embodiments, the circuitry 304 includes a bit line control circuit 320 configured to pre-charge the bit line capacitor 306 in a charging phase, as illustrated in FIG. 3B. The bit line control circuit 320 can include a first transistor 322 and a second transistor 324 that are coupled in series between a supply voltage VDDI and the bit line 301 (or the bit line capacitor 306 at node A 303). The first transistor 322 has a first terminal coupled to the second transistor 324, a second terminal coupled to the bit line 301 (or the bit line capacitor 306 at node A 303), and a gate node configured to receive a first control signal BLC1. The second transistor 324 has a first terminal coupled to the supply voltage VDDI, a second terminal coupled to the first terminal of the first transistor 322, and a gate node configured to receive a second control signal BLC2. Each of the first transistor 322 and the second transistor 324 can be an n-channel transistor, e.g., an NMOS transistor.

FIG. 3B shows a timing diagram 350 illustrating voltage level changes at different nodes of the memory device 300 of FIG. 3A during a series of operation phases including a bit line charging phase 352, a bit line development phase 354, and a bit line sensing phase 356. As shown in FIG. 3B, in the bit line charging phase 352, both the first control signal BLC1 and the second control signal BLC2 provide high voltage levels to turn on the first transistor 322 and the second transistor 324, which thereby turn on a charging path from the bit line control circuit 320 to the bit line 301 to charge the bit line capacitor 306. The second control signal BLC2 can have a higher voltage level (e.g., BLC1_CHG_REF+$\Delta V_1$) than that of the first control signal BLC1 (e.g., BLC1_CHG_REF), such that the charging path can be formed. As shown in FIG. 3B, a voltage level at node A can gradually increase to a high voltage level while the bit line capacitor 306 is charged.

During the charging phase 352, the strings 312 in the multiple blocks 310 are turned off, e.g., by turning off the SSTs 314 in the strings 312 that are coupled to the SSL provided with a low voltage level. The GSL can be provided with a high voltage level to turn on the GSTs 318 during the series of operation phases. In some embodiments, the GSL can be also provided a low voltage level to turn off the GSTs 318 during the bit line charging phase 352 and provided a high voltage level to turn on the GSTs 318 during the other operation phases including the bit line development phase 354 and the bit line sensing phase 356.

During the bit line development phase 354, as shown in FIG. 3B, the bit line control circuit 320 is turned off, e.g., by turning off both the first transistor 322 and the second transistor 324 with the first control signal BLC1 and the second control signal BLC2 at low voltage levels. The strings 312 are turned on, e.g., by turning on the SSTs 314 with the SSL at a high voltage level, turning on (or keeping) the GSTs 318 with the GSL at a high voltage level, and applying a read voltage to a selected word line and a high voltage to other word lines. In such a way, as shown in FIG. 3A, the forward current path 311 is formed from the bit line 301 through the strings 312 of the multiple blocks 310 to the CSL 307 coupled to the ground (GND) to discharge the bit line capacitor 306 that is pre-charged in the bit line charging phase 352.

If all the memory cells in the strings 312 have a high threshold voltage Vt, the voltage level at node A 303 may be no greater than a voltage level of the strings 312 (or the threshold voltage level(s) of the memory cells) and thus there may be no current following from the bit line 301 to the strings 312. Accordingly, the bit line capacitor 306 may not be discharged and the voltage level at node A may keep at a high voltage level, as shown in FIG. 3B. If a memory cell in at least one string 312 among the strings 312 has a low threshold voltage Vt, the voltage level at node A 303 can be greater than a voltage level of the at least one string 312 and thus a current flows, along the forward current path 311, from the bit line 301 to the at least one string 312 to the CSL 307. Accordingly, the bit line capacitor 306 is discharged and the voltage level at node A may gradually decrease to a low voltage level, as shown in FIG. 3B.

In some embodiments, the circuitry 304 can further be configured to, in the bit line sensing phase 356, sense voltage threshold levels of memory cells in the strings 312 of the multiple blocks 310 by conductively connecting the bit line capacitor 306 (or the bit line 301) to a sensing capacitor 336 (or a sensing node 335) that is pre-charged. The sensing node can be coupled to at least one latch circuit in a page buffer (e.g., the page buffer 222 of FIG. 2). The sensing capacitor 336 can be an equivalent transistor including at least one of a transistor capacitor or a parasitic capacitor associated with the at least one latch circuit.

In some embodiments, the circuitry 304 includes a pre-charging circuit 330 coupled to the sensing capacitor 336 at the sensing node 335 and configured to charge the sensing capacitor 336 before the bit line sensing phase 356, e.g., during the bit line development phase 354 as shown in FIG. 3B. In some embodiments, as shown in FIG. 3A, the precharging circuit 330 includes a first transistor 332 and a second transistor 334 coupled in series between a supply voltage VPW and the sensing node 335. A voltage level of the supply voltage VPW can be different from or same as a voltage level of VDDI. The first transistor 332 can be a p-channel transistor, e.g., a PMOS transistor, and the second transistor 334 can be an n-channel transistor, e.g., an NMOS transistor. The first transistor 332 can have a first terminal coupled to the supply voltage VPW, a second terminal coupled to the second transistor 334, and a gate node for receiving a precharging control signal PIDL. The second transistor 334 can have a first terminal coupled to the second terminal of the first transistor 332, a second terminal coupled to the sensing node 335, and a gate terminal for receiving a precharging enable signal PSNS.

The circuitry 304 can further include a switch transistor 326 coupled between the bit line 301 and the sensing node 335. In some embodiments, the first transistor 322 in the bit line control circuit 320 is coupled between the bit line 301 and the switch transistor 326. The switch transistor 326 has a first terminal coupled to the sensing node 335 (or the sensing capacitor 336), a second terminal coupled to the first transistor 322, and a gate terminal for receiving a third control signal BLC3. The switch transistor 326 can be configured to be turned off during the bit line charging phase 352 and the bit line development phase 354 and to be turned on only during the bit line sensing phase 356. In such a way, the sensing capacitor 336 can be pre-charged independently from the bit line capacitor 306 being pre-charged during the bit line charging phase 352 and/or discharged during the bit line development phase 354.

In the bit line sensing phase 356, the switch transistor 326 is turned on with the third control signal BLC3 at a high voltage level and the first transistor 322 is turned on with the first control signal BLC1 at a high voltage level, such that the sensing capacitor 336 is conductively coupled to the bit line capacitor 306, the bit line 301, and the strings 312. The strings 312 can be turned on. The third control signal BLC3 can have a higher voltage level (e.g., BLC1_SEN_REF+ $\Delta V_2$) than that of the first control signal BLC1 (e.g., BLC1_SEN_REF), such that a current still flows along the forward current path 311. The bit line capacitor 306 can have a substantially greater (e.g., one or more orders of magnitude) capacitance than the sensing capacitor 336, the bit line capacitor 306 and the sensing capacitor 336 can complete charge sharing in a short time period. Therefore, a voltage level at the sensing node 335 (e.g., the voltage level of the sensing capacitor 336) can become corresponding to a voltage level at node A 303 (e.g., the voltage level of the bit line capacitor 306), which can indicate a voltage level of the memory cells in the strings 312.

For example, as shown in FIG. 3B, if the voltage level at the sensing node 335 keeps at a high voltage level, it indicates that the voltage level at node A 303 is at a high voltage level, which indicates memory cells in all the strings 312 in the multiple blocks 310 have high threshold voltages. If the voltage level at the sensing node 335 decreases to a low voltage level, it indicates that the voltage level at node A 303 is also at a low voltage level, which indicates a memory cell in at least one string 312 among the strings 312 has a low threshold voltage Vt.

In some embodiments, the circuitry 304 optionally includes a discharging circuit 328 that includes a discharging transistor, e.g., an n-channel transistor. The discharging transistor has a first terminal coupled to the bit line 301 or the bit line capacitor 306, a second terminal coupled to the ground, and a gate terminal for receiving a discharging signal PRST. The discharging circuit 328 can be configured to discharge the bit line capacitor 306 to the ground at an initial phase before the bit line charging phase 352.

In some embodiments, a page buffer coupled to the bit line 301 includes at least one of the bit line control circuit 320, the switch transistor 326, the precharging circuit 330, the sensing capacitor 336, or the discharging circuit 328. In some embodiments, the circuitry 304 includes a control logic (e.g., the control logic 204) configured to generate control signals, e.g., BLC1, BLC2, BLC3, PIDL, PSNS, PRST, and CSEN_SM, to control components in the memory device 300.

Figure 3C:
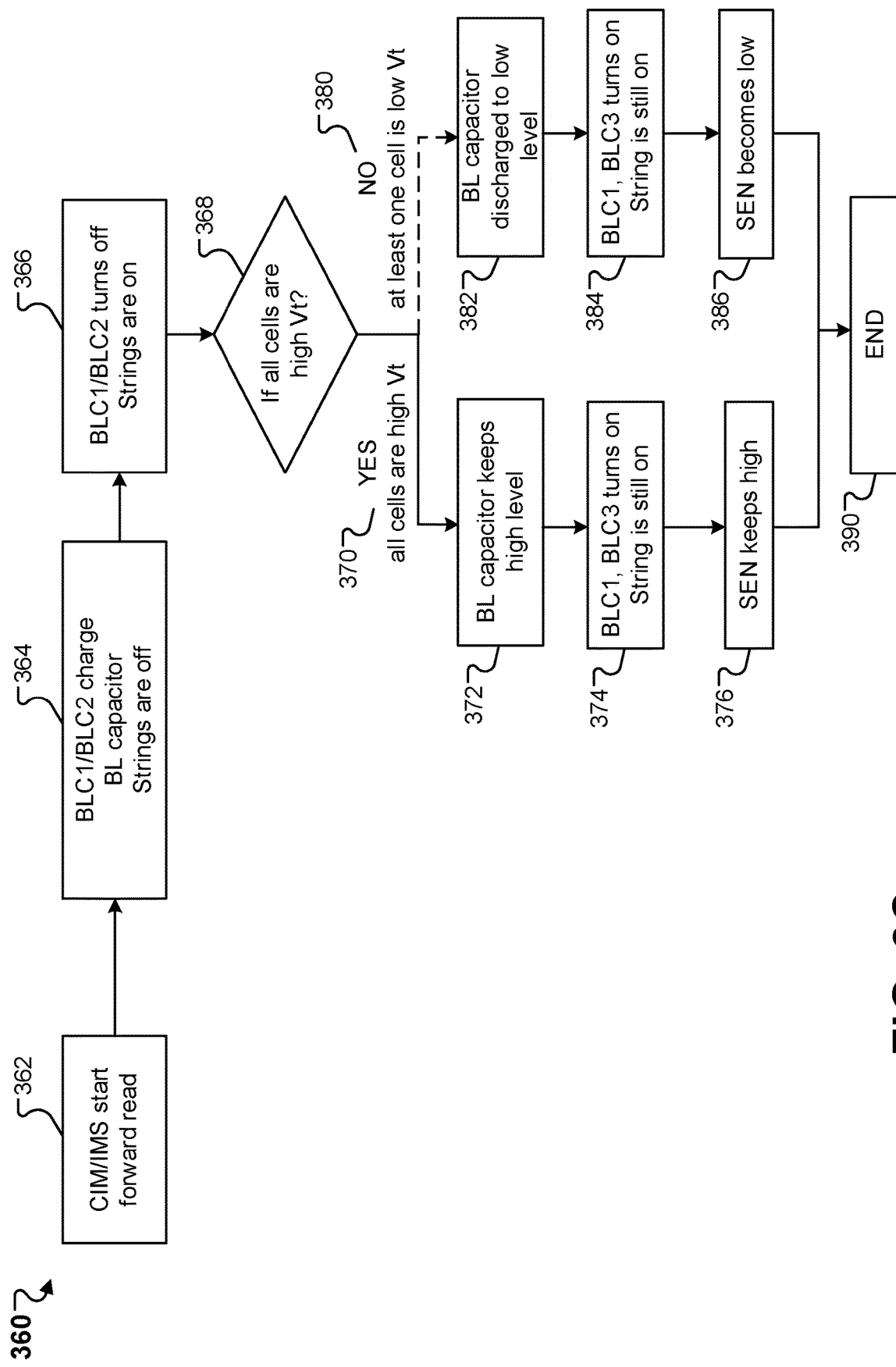
FIG. 3C is a flow chart of an example process for performing the multi-block operation using the forward voltage read in the memory device of FIG. 3A, according to one or more implementations of the present disclosure.

FIG. 3C is a flow chart of an example process 360 for performing the multi-block operation using the forward voltage read in the memory device 300 of FIG. 3A, according to one or more implementations of the present disclosure. The process 360 can be performed by the memory device 300 of FIG. 3A (e.g., the control logic of the memory device 300).

At 362, the memory device 300 receives a command, e.g., from a controller such as the device controller 112 or the host controller 122 of FIG. 1A. The command can include a multi-block operation for CIM or IMS. The command can also indicate to perform a forward voltage read.

At 364, in the bit line charging phase 352, the strings 312 are off, and the bit line control circuit 320 is turned on by turning on the first transistor 322 and the second transistor 324 with the first control signal BLC1 and the second control signal BLC2 to charge the bit line capacitor 306.

At 366, in the bit line development phase 354, the strings 312 are turned on (e.g., by controlling the SSL and the GSL as shown in FIG. 3B), and the bit line control circuit 320 is turned off, e.g., by turning off the first transistor 322 and the second transistor 324 with the control signals BLC1, BLC2. The CSL 307 can be coupled to the ground (GND). The sensing capacitor 336 can be charged to a high voltage level, e.g., by the precharging circuit 330, with the switch transistor being turned off.

Whether a forward current path, e.g., 311, can be formed, from the bit line capacitor 306 through the strings 312 to the CSL 307 depends on whether memory cells in the strings 312 have high threshold voltage Vt (368). If memory cells in all the strings 312 have a high threshold voltage Vt (370), the forward current path cannot be formed and the bit line capacitor 306 keeps at a high voltage level. If a memory cell in at least one of the strings 312 has a low threshold voltage Vt (380), the forward current path can be formed and the bit line capacitor 306 is discharged to a low voltage level (382).

In the bit line sensing phase 356, at step 374 or step 384, the switch transistor 326 and the first transistor 322 are turned on by corresponding control signals BLC3 and BLC1 and the strings 312 can be still on, such that the sensing capacitor 336 is conductively coupled to the bit line capacitor 306, and a voltage level of the sensing capacitor 336 (or at the sensing node 335) can become correspond to a voltage level of the bit line capacitor 306 (or at node A 303). For example, if the bit line capacitor 306 keeps at a high voltage level (372), the sensing node 335 also keeps at a high voltage level (376). If the bit line capacitor 306 is discharged to a low voltage level (382), the sensing node 335 also becomes to a low voltage level (386).

After the bit line sensing phase 356, the process 360 ends at step 390. The process 360 can further include latching a sensing result, e.g., "1" representing a high voltage level at the sensing node 335 or "0" representing a low voltage level at the sensing node 335, into a latch circuit coupled to the sensing node 335 in the page buffer.

Figure 3D:
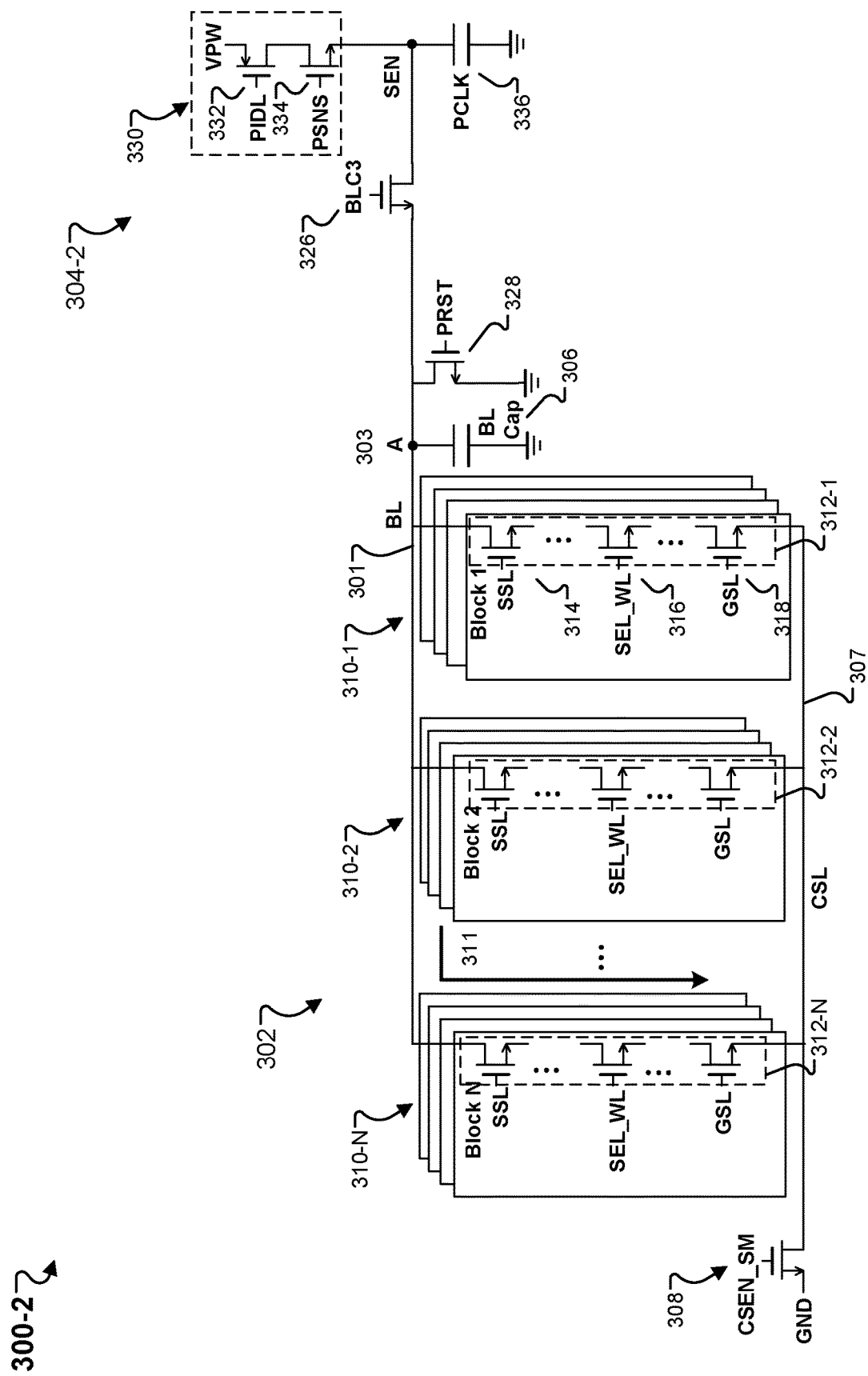
FIG. 3D is a schematic diagram illustrating another example of a memory device for performing a multi-block operation using forward voltage read in the memory device, according to one or more implementations of the present disclosure.
Figure 3E:
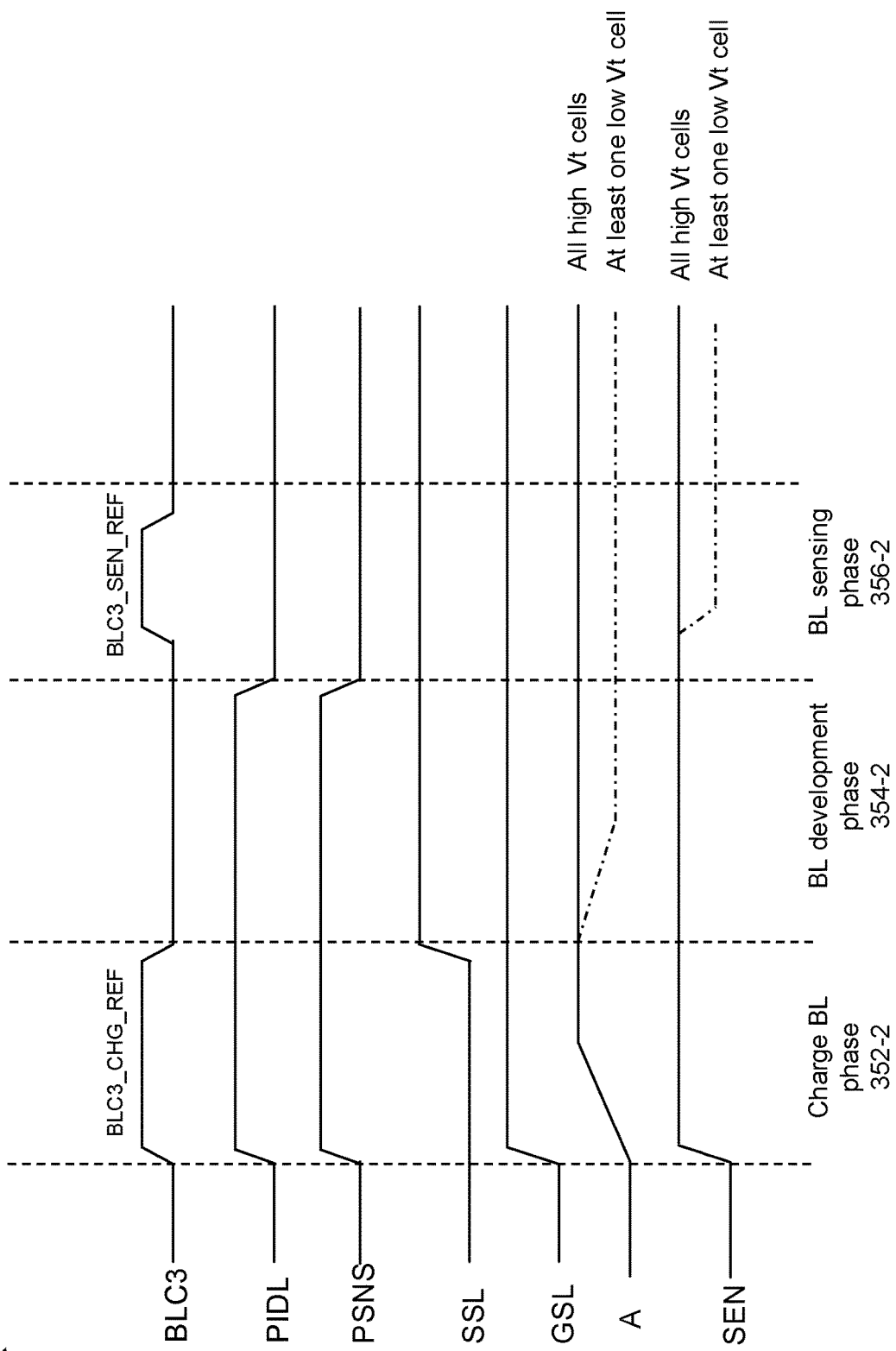
FIG. 3E shows a timing diagram illustrating voltage level changes at different nodes of the memory device of FIG. 3D during a series of operation phases, according to one or more implementations of the present disclosure.
Figure 3F:
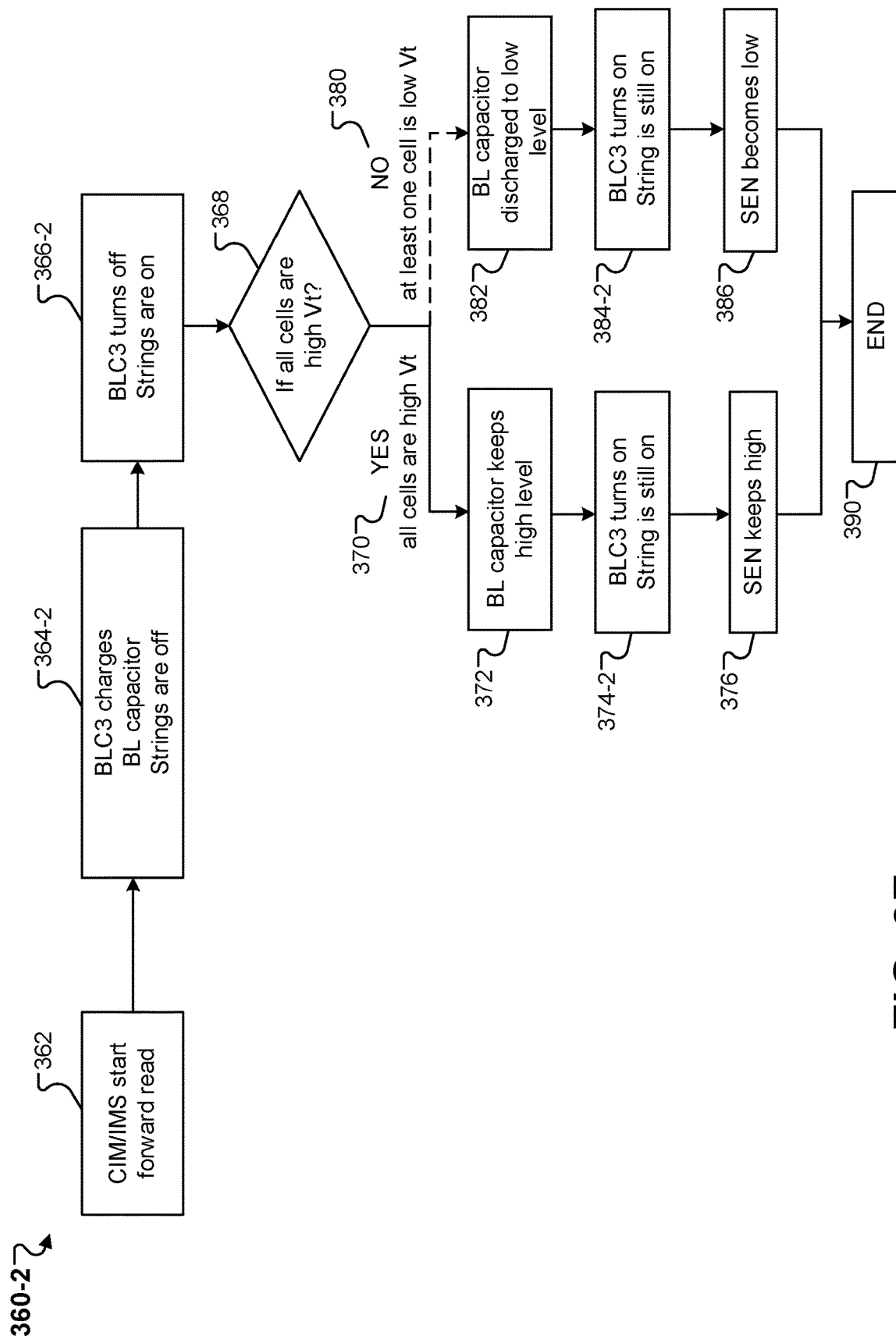
FIG. 3F is a flow chart of an example process for performing the multi-block operation using the forward voltage read in the memory device of FIG. 3D, according to one or more implementations of the present disclosure.

FIG. 3D is a schematic diagram illustrating another example of a memory device 300-2 for performing a multi-block operation using forward voltage read in the memory device 300-2, according to one or more implementations of the present disclosure. The memory device 300-2 can be the memory 116 of FIG. 1A or the memory device 200 of FIG. 2. FIG. 3E shows a timing diagram 350-2 illustrating voltage level changes at different nodes of the memory device 300-2 of FIG. 3D during a series of operation phases, according to one or more implementations of the present disclosure. The timing diagram 350-2 can be similar to the timing diagram 350 except one or more differences as described below. FIG. 3F is a flow chart of an example process 360-2 for performing the multi-block operation using the forward voltage read in the memory device 300-2 of FIG. 3D, according to one or more implementations of the present disclosure. The process 360-2 can be similar to the process 360 except that one or more steps are different as described below.

As illustrated in FIG. 3D, the memory device 300-2 is similar to the memory device 300, except that a circuitry 304-2 in the memory device 300-2 does not include the bit line control circuit 320 in the memory device 300, and the switch transistor 326 is directly coupled to the bit line 301 and the bit line capacitor 306. The multi-block operation performed in the memory device 300-2 can be similar to the multi-block operation performed in the memory device 300, except that the bit line capacitor 306 is pre-charged in a different manner.

As noted above, e.g., as illustrated in FIGS. 3A-3C, in the memory device 300, the bit line capacitor 306 is pre-charged by the bit line control circuit 320 in the charging phase 352, with the first transistor 322 and the second transistor 324 in the bit line control circuit 320 being turning on and the switch transistor 326 being turning off. In contrast, in the memory device 300-2, the bit line capacitor 306 is pre-charged by the precharging circuit 330 in the charging phase 352-2, with the first transistor 332 and the second transistor 334 in the precharging circuit 330 being turning on and the switch transistor 326 being turning on.

As illustrated in FIGS. 3E and 3F, during the bit line charging phase 352-2, at step 364-2, the switch transistor 326 is turned on by the control signal BLC3 at a high voltage level (e.g., BLC3_CHG_REF). The precharging circuit 330 is turned on by turning on the first transistor 332 and the second transistor 334 with the corresponding first control signal PIDL and second control signal PSNS at high voltage levels. Accordingly, the charging path from the precharging circuit 330 through the switch transistor 326 to the bit line 301 is turned on to charge the bit line capacitor 306. As shown in FIG. 3E, a voltage level at node A can gradually increase to a high voltage level while the bit line capacitor 306 is charged. Similar to the memory device 300, in the memory device 300-2, during the charging phase 352-2, at step 364-2, the strings 312 in the multiple blocks 310 are turned off, e.g., by turning off the SSTs 314 in the strings 312 that are coupled to the SSL provided with a low voltage level. Also, during the bit line charging phase 352-2, as the precharging circuit 330 is on, with the first control signal PIDL and the second control signal PSNS at the high voltage levels, the precharging circuit 330 can charge the sensing capacitor 336 accordingly to cause the sensing node SEN to have a high voltage level, e.g., as shown in FIG. 3E.

During the bit line development phase 354-2, at step 366-2, the switch transistor 326 is turned off by the control signal BLC3 at a low voltage level. The precharging circuit 330 can be kept on by keeping the first transistor 332 and the second transistor 334 with the first control signal PIDL and the second control signal PSNS at the high voltage levels. The precharging circuit 330 can be kept on to charge the sensing capacitor 336 or to keep the sensing capacitor 336 at the high voltage level before a bit line sensing phase 356-2, e.g., as shown in FIG. 3E.

In the bit line development phase 354-2, at step 366-2, the strings 312 are turned on, e.g., by turning on the SSTs 314 with the SSL at a high voltage level, turning on (or keeping) the GSTs 318 with the GSL at a high voltage level, and applying a read voltage to a selected word line and a high voltage to other word lines. In such a way, as shown in FIG. 3D, the forward current path 311 is formed from the bit line 301 through the strings 312 of the multiple blocks 310 to the CSL 307 coupled to the ground (GND) to discharge the bit line capacitor 306 that is pre-charged in the bit line charging phase 352-2.

If all the memory cells in the strings 312 have a high threshold voltage Vt, the voltage level at node A 303 may be no greater than a voltage level of the strings 312 (or the threshold voltage level(s) of the memory cells) and thus there may be no current following from the bit line 301 to the strings 312. Accordingly, the bit line capacitor 306 may not be discharged and the voltage level at node A may keep at a high voltage level, as shown in FIG. 3E. If a memory cell in at least one string 312 among the strings 312 has a low threshold voltage Vt, the voltage level at node A 303 can be greater than a voltage level of the at least one string 312 and thus a current flows, along the forward current path 311, from the bit line 301 to the at least one string 312 to the CSL 307. Accordingly, the bit line capacitor 306 is discharged and the voltage level at node A may gradually decrease to a low voltage level, as shown in FIG. 3E.

The circuitry 304-2 can be configured to, in the bit line sensing phase 356-2, sense voltage threshold levels of memory cells in the strings 312 of the multiple blocks 310 by conductively connecting the bit line capacitor 306 (or the bit line 301) to a sensing capacitor 336 (or a sensing node 335) that is pre-charged.

For example, as shown in FIG. 3E, if the voltage level at the sensing node 335 keeps at a high voltage level, it indicates that the voltage level at node A 303 is at a high voltage level, which indicates memory cells in all the strings 312 in the multiple blocks 310 have high threshold voltages. If the voltage level at the sensing node 335 decreases to a low voltage level, it indicates that the voltage level at node A 303 is also at a low voltage level, which indicates a memory cell in at least one string 312 among the strings 312 has a low threshold voltage Vt.

During the bit line sensing phase 356-2, at step 374-2 or step 384-2, the switch transistor 326 is turned on by the corresponding control signal BLC3 at a high voltage level (e.g., BLC3_SEN_REF that can be identical to or different from BLC3_CHG_REF) and the strings 312 can be still on, such that the sensing capacitor 336 is conductively coupled to the bit line capacitor 306, and a voltage level of the sensing capacitor 336 (or at the sensing node 335) can become corresponding to a voltage level of the bit line capacitor 306 (or at node A 303). For example, if the bit line capacitor 306 keeps at a high voltage level (372), the sensing node 335 also keeps at a high voltage level (376). If the bit line capacitor 306 is discharged to a low voltage level (382), the sensing node 335 also becomes to a low voltage level (386).

After the bit line sensing phase 356-2, the process 360-2 ends at step 390. The process 360-2 can further include latching a sensing result, e.g., "1" representing a high voltage level at the sensing node 335 or "0" representing a low voltage level at the sensing node 335, into a latch circuit coupled to the sensing node 335 in the page buffer.

Example Reverse Voltage Read

Figure 4A:
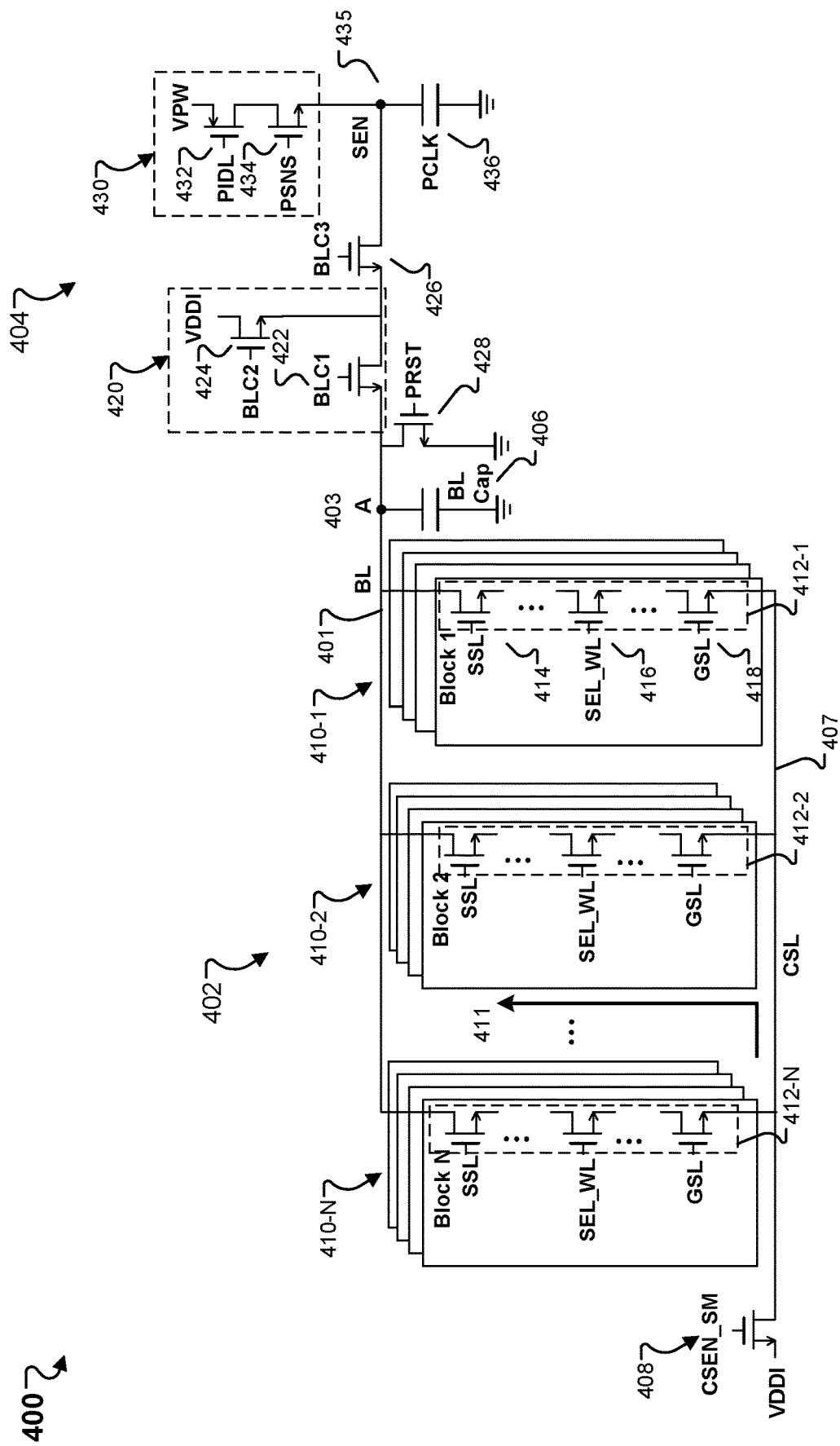
FIG. 4A is a schematic diagram illustrating an example of a memory device for performing a multi-block operation using reverse voltage read in the memory device, according to one or more implementations of the present disclosure.

FIG. 4A illustrates an example of a memory device 400 for performing a multi-block operation using reverse voltage read in the memory device 400, according to one or more implementations of the present disclosure. The memory device 400 can be the memory 116 of FIG. 1A or the memory device 200 of FIG. 2. The memory device 400 can be similar to the memory device 300 of FIG. 3A, except that a CSL 407 is coupled to a supply voltage VDDI, instead of a ground (GND) in the memory device 300, through a control transistor 408, such that a reverse current path 411 can be formed from the CSL 407 through strings of multiple blocks to a bit line 401.

Similar to the memory device 300 of FIG. 3A, the memory device 400 includes a memory cell array 402 (e.g., the memory cell array 210 of FIG. 2 or 302 of FIG. 3A). The memory cell array 402 can include a plurality of blocks (e.g., the block 140 of FIG. 1B or the block 150 of FIG. 1C) coupled to a plurality of bit lines (e.g., the bit line $BL_0$, $BL_1$, ..., $BL_{n-1}$, and $BL_n$ of FIG. 1B or $BL_{<n>}$ and $BL_{<n+1>}$ of FIG. 1C). Each bit line can be coupled to a respective group of multiple blocks. As illustrated in FIG. 4A, a bit line (BL) 401 is coupled to a respective string 412-1, 412-2, ..., 412-N (referred to generally as strings 412 and individually as string 412) in each of N blocks 410-1, 410-2, ..., 410-N (referred to generally as blocks 410 and individually as block 410).

A string 412 can be the cell string 144 of FIG. 1B or the cell string 154 of FIG. 1C or the string 312 of FIG. 3A. As illustrated in FIG. 4A, the string 412 can include a number of memory cells 416 (e.g., the memory cells 141 of FIG. 1B or 157 of FIG. 1C or 316 of FIG. 3A), a string select transistor (SST) 414 (e.g., SST 143 of FIG. 1B or SST of FIG. 1C or 414 of FIG. 3A), and a ground select transistor (GST) 418 (e.g., GST 145 of FIG. 1B or GST of FIG. 1C or 418 of FIG. 3A), which are all connected in series. The SST 414 is coupled to a string select line (SSL) (e.g., SSL 146 of FIG. 1B or SSL 156 of FIG. 1C), and the GST 318 is coupled to a ground select line (GSL) (e.g., GSL 148 of FIG. 1B or GSL 158 of FIG. 1C). Gates of the memory cells 416 are respectively connected to word lines $WL_0$, $WL_1$, ..., $WL_{n-1}$, $WL_n$. A memory cell can be individually selected by a bit line and a word line (e.g., a selected word line SEL_WL). The strings 412 in the multiple blocks 410 are connected to the CSL 407 (e.g., the CSL 149 of FIG. 1B, the CSL 159 of FIG. 1C, or the CSL 307 of FIG. 3A) via the GSTs 418 in the strings 412.

Different from the CSL 307 of FIG. 3A, the CSL 407 can be coupled to a supply voltage VDDI through the control transistor 408. The control transistor 408 can include a first terminal coupled to the CSL 407 and a second terminal coupled to the VDDI, and a gate node coupled to a control signal CSEN_SM. The control transistor 408 can be an n-channel transistor, e.g., NMOS transistor. The control transistor 408 can be configured to be turned on or off by the control signal CSEN_SM. For example, when the control signal CSEM_SM is at a high voltage level, the control transistor 408 is turned on and the CSL 407 is conductively coupled to the supply voltage VDDI; when the control signal CSEM_SM is at a low voltage level, the control transistor 408 is turned off and the CSL 407 is not conductively coupled to the supply voltage VDDI.

As illustrated in FIG. 4A, a bit line capacitor 406 is coupled between the bit line 401 at node A 403 and a ground (GND). The bit line capacitor 406 can be an equivalent capacitor that can include a parasitic capacitor formed between the bit line 401 and at least one adjacent bit line in the memory device 400. In some embodiments, the bit line capacitor 406 includes, besides the parasitic capacitor, a physical capacitor that can be made of a transistor, e.g., an MOS transistor.

As described with further details below, the memory device 400 includes circuitry 404 coupled to the memory cell array 402 and the bit line 401. The circuitry 404 is configured to perform a multi-block operation on the memory cell array 402 based on the bit line capacitor 406, e.g., by forming a reverse current path 411 from the CSL 407 coupled to the supply voltage VDDI through the strings 412 to the bit line 401 to charge the bit line capacitor 406 that is pre-discharged.

In some embodiments, the circuitry 404 includes a discharging circuit 428 that includes a discharging transistor, e.g., an n-channel transistor. The discharging transistor has a first terminal coupled to the bit line 401 or the bit line capacitor 406, a second terminal coupled to the ground, and a gate terminal for receiving a discharging signal PRST. The discharging circuit 428 can be configured to discharge the bit line capacitor 406 to the ground.

Figure 4B:
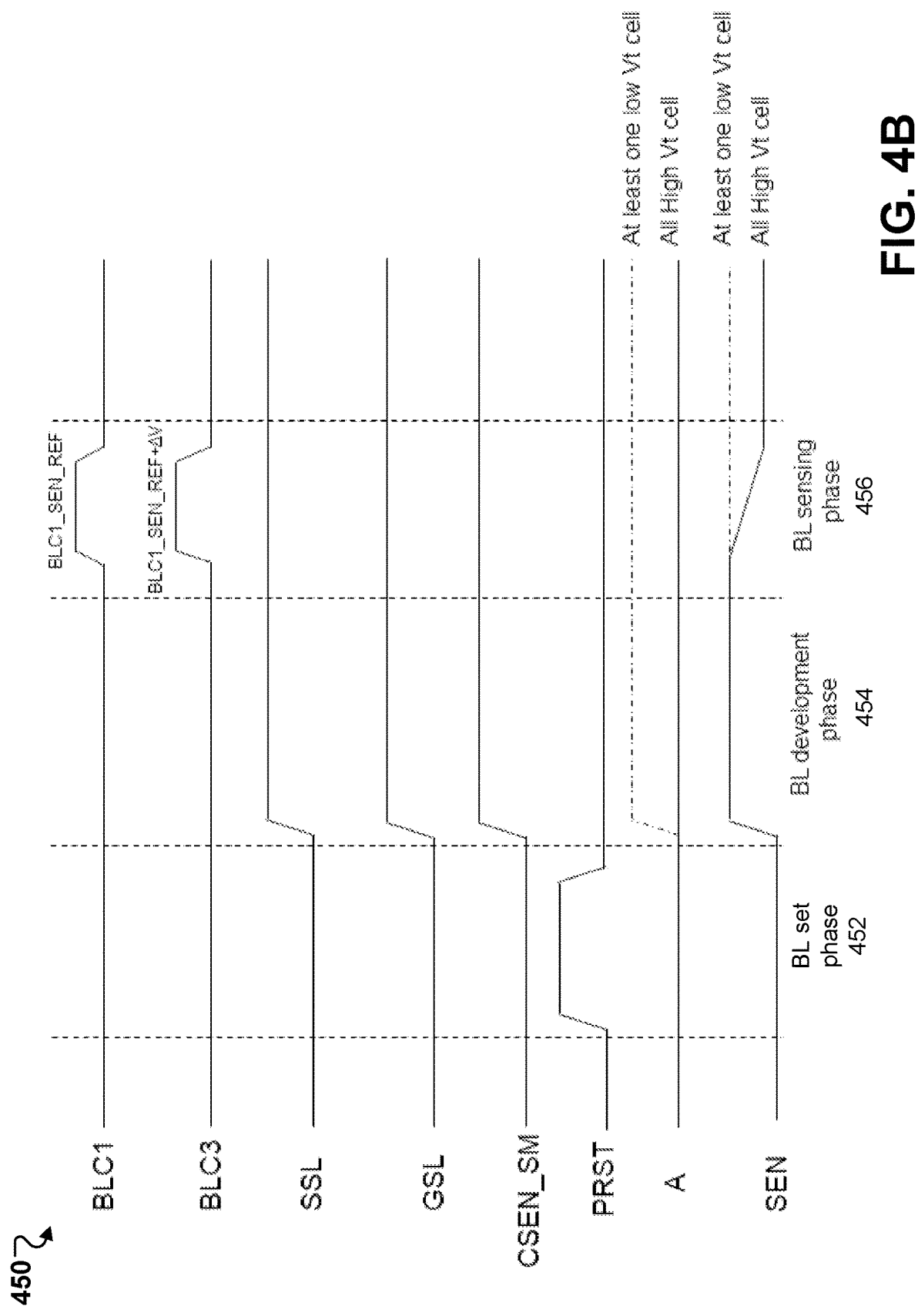
FIG. 4B shows a timing diagram illustrating voltage level changes at different nodes of the memory device of FIG. 4A during a series of operation phases, according to one or more implementations of the present disclosure.

FIG. 4B shows a timing diagram 450 illustrating voltage level changes at different nodes of the memory device 400 of FIG. 4A during a series of operation phases including a bit line setting phase (or an initial phase) 452, a bit line development phase 454, and a bit line sensing phase 456.

Different from the bit line capacitor 306 being charged in the first operation phase (e.g., the bit line charging phase 352 of FIG. 3B), the bit line capacitor 406 is first discharged by the discharging circuit 428 to a low voltage level, e.g., the ground. As shown in FIG. 3B, the discharging circuit 428 can be turned on by turning on the discharging transistor with the control signal PRST at a high voltage level. The strings 412 are turned off, e.g., by providing the SSL and GSL with a low voltage level. The CSL 407 can be disconnected from the supply voltage VDDI, e.g., by turning off the control transistor 408 with the control signal CSEN_SM at a low voltage level. The voltage level at node A 403 can be at a low voltage level after the bit line capacitor 406 is discharged.

During the bit line development phase 454, as shown in FIG. 4B, the discharging circuit 428 is turned off, e.g., by turning off the discharging transistor with the control signal PRST. The discharging circuit 428 can be turned off for the remaining phases of the multi-block operation. The strings 412 are turned on, e.g., by turning on the SSTs 414 with the SSL having a high voltage level, turning on the GSTs 418 with the GSL at a high voltage level, and applying a read voltage to a selected word line and a high voltage to other word lines. The control transistor 408 is turned on during the bit line development phase 454 (and the bit line sensing phase 456) by proving the control signal CSEN_SM at a high voltage level, such that the CSL 407 is conductively coupled to the supply voltage VDDI and is charged to have a high voltage level. In such a way, as shown in FIG. 4A, the reverse current path 311 can be formed from the CSL 407 coupled to the supply voltage VDDI through the strings 412 to the bit line 401 to charge the bit line capacitor 406 that is pre-discharged by the discharging circuit 428 in the bit line setting phase 452.

If all the memory cells in the strings 412 have a high threshold voltage Vt, the voltage level at the CSL 407 may be no greater than a voltage level of the strings 412 (or the threshold voltage level(s) of the memory cells) and thus there may be no current following from the CSL 407 to the strings 412 and then to the bit line capacitor 406. Accordingly, the bit line capacitor 406 may not be charged and the voltage level at node A may keep at a low voltage level, as shown in FIG. 4B. If a memory cell in at least one string 412 among the strings 412 has a low threshold voltage Vt, the voltage level at the CSL 407 can be greater than a voltage level of the at least one string 412, and thus a current flows, along the reverse current path 411, from the CSL 407 through the at least one string 412 to the bit line 401 and the bit line capacitor 406. Accordingly, the bit line capacitor 406 can be charged and the voltage level at node A may gradually increase to a high voltage level, as shown in FIG. 4B.

In some embodiments, the circuitry 404 can further be configured to, in the bit line sensing phase 456, sense voltage threshold levels of memory cells in the strings 412 of the multiple blocks 410 by conductively connecting the bit line capacitor 406 (or the bit line 401) to a sensing capacitor 436 (or a sensing node 435) that is pre-charged. The sensing node can be coupled to at least one latch circuit in a page buffer (e.g., the page buffer 222 of FIG. 2). The sensing capacitor 436 can be an equivalent transistor including at least one of a transistor capacitor or a parasitic capacitor associated with the at least one latch circuit. The sensing capacitor 436 can be similar to, or the same as, the sensing capacitor 336 of FIG. 3A.

In some embodiments, the circuitry 404 includes a precharging circuit 430 coupled to the sensing capacitor 436 at the sensing node 435 and configured to charge the sensing capacitor 436 before the bit line sensing phase 456, e.g., during the bit line development phase 454 as shown in FIG. 4B. The precharging circuit 430 can be similar to, or the same as, the precharging circuit 330 of FIG. 3A. In some embodiments, as shown in FIG. 4A, the precharging circuit 430 includes a first transistor 432 and a second transistor 434 coupled in series between a supply voltage VPW and the sensing node 435. A voltage level of the supply voltage VPW can be different from or same as a voltage level of VDDI. The first transistor 432 can be a p-channel transistor, e.g., a PMOS transistor, and the second transistor 434 can be an n-channel transistor, e.g., an NMOS transistor. The first transistor 432 can have a first terminal coupled to the supply voltage VPW, a second terminal coupled to the second transistor 434, and a gate node for receiving a precharging control signal PIDL. The second transistor 434 can have a first terminal coupled to the second terminal of the first transistor 432, a second terminal coupled to the sensing node 435, and a gate terminal for receiving a precharging enable signal PSNS.

The circuitry 404 can further include a switch transistor 426 coupled between the bit line 401 and the sensing node 435. The switch transistor 426 is similar to, or the same as the switch transistor 326 of FIG. 3A. In some embodiments, a first transistor 422 is optionally coupled between the bit line 401 and the switch transistor 426. The first transistor 422 can be turned on or off by a first control signal BLC1. The switch transistor 426 has a first terminal coupled to the sensing node 435 (or the sensing capacitor 436), a second terminal coupled to the first transistor 422, and a gate terminal for receiving a third control signal BLC3. The switch transistor 426 can be configured to be turned off during the bit line charging phase 452 and the bit line development phase 454 and to be turned on only during the bit line sensing phase 456. In such a way, the sensing capacitor 436 can be pre-charged independently from the bit line capacitor 406 being pre-discharged during the bit line charging phase 452 and/or charged during the bit line development phase 454.

In the bit line sensing phase 456, the switch transistor 426 is turned on with the third control signal BLC3 having a high voltage level and the first transistor 422 is turned on with the first control signal BLC1 having a high voltage level, such that the sensing capacitor 436 is conductively coupled to the bit line capacitor 406, the bit line 401, and the strings 412. The strings 412 can be turned on. The first control signal BLC1 can have a smaller voltage level (e.g., BLC1_SEN_REF) than that of the third control signal BLC3 (e.g., BLC1_SEN_REF+$\Delta$V), e.g., as illustrated in FIG. 4B. The bit line capacitor 406 can have a substantially greater (e.g., one or more orders of magnitude) capacitance than the sensing capacitor 436, the bit line capacitor 406 and the sensing capacitor 436 can complete charge sharing in a short time period. Therefore, a voltage level at the sensing node 435 (e.g., the voltage level of the sensing capacitor 436) can become corresponding to a voltage level at node A 403 (e.g., the voltage level of the bit line capacitor 406), which can indicate a voltage level of the memory cells in the strings 412.

For example, as shown in FIG. 4B, if the voltage level at the sensing node 435 keeps at a high voltage level, it indicates that the voltage level at node A 403 is at a high voltage level, which indicates a memory cell in at least one string 412 among the strings 412 has a low threshold voltage Vt. If the voltage level at the sensing node 435 decreases to a low voltage level, it indicates that the voltage level at node A 403 is also at a low voltage level, which indicates that memory cells in all the strings 412 in the multiple blocks 410 have high threshold voltages.

In some embodiments, the memory device 400 includes a bit line control circuit 420 configured to charge the bit line capacitor 406. The bit line control circuit 420 can include the first transistor 422 and a second transistor 424 that are coupled in series between a supply voltage VDDI and the bit line 401 (or the bit line capacitor 406 at node A 403). The first transistor 422 has a first terminal coupled to the second transistor 424, a second terminal coupled to the bit line 401 (or the bit line capacitor 406 at node A 403), and a gate node configured to receive the first control signal BLC1. The second transistor 424 has a first terminal coupled to the supply voltage VDDI, a second terminal coupled to the first terminal of the first transistor 422, and a gate node configured to receive a second control signal BLC2. Each of the first transistor 422 and the second transistor 424 can be an n-channel transistor, e.g., an NMOS transistor. As the bit line capacitor 406 is discharged, instead of being charged in the forward voltage read as described with reference to FIGS. 3A-3C, before the bit line development phase 456, the reverse voltage read as described with reference to FIGS. 4A-4C does not need to use the bit line control circuit 420, e.g., as described with further details in FIGS. 4D-4F. In some embodiments, a page buffer coupled to the bit line 401 includes at least one of the bit line control circuit 420, the switch transistor 426, the precharging circuit 430, the sensing capacitor 436, or the discharging circuit 428. In some embodiments, the circuitry 404 includes a control logic (e.g., the control logic 204) configured to generate control signals, e.g., BLC1, BLC3, PIDL, PSNS, PRST, and CSEN_SM, to control components in the memory device 400.

Figure 4C:
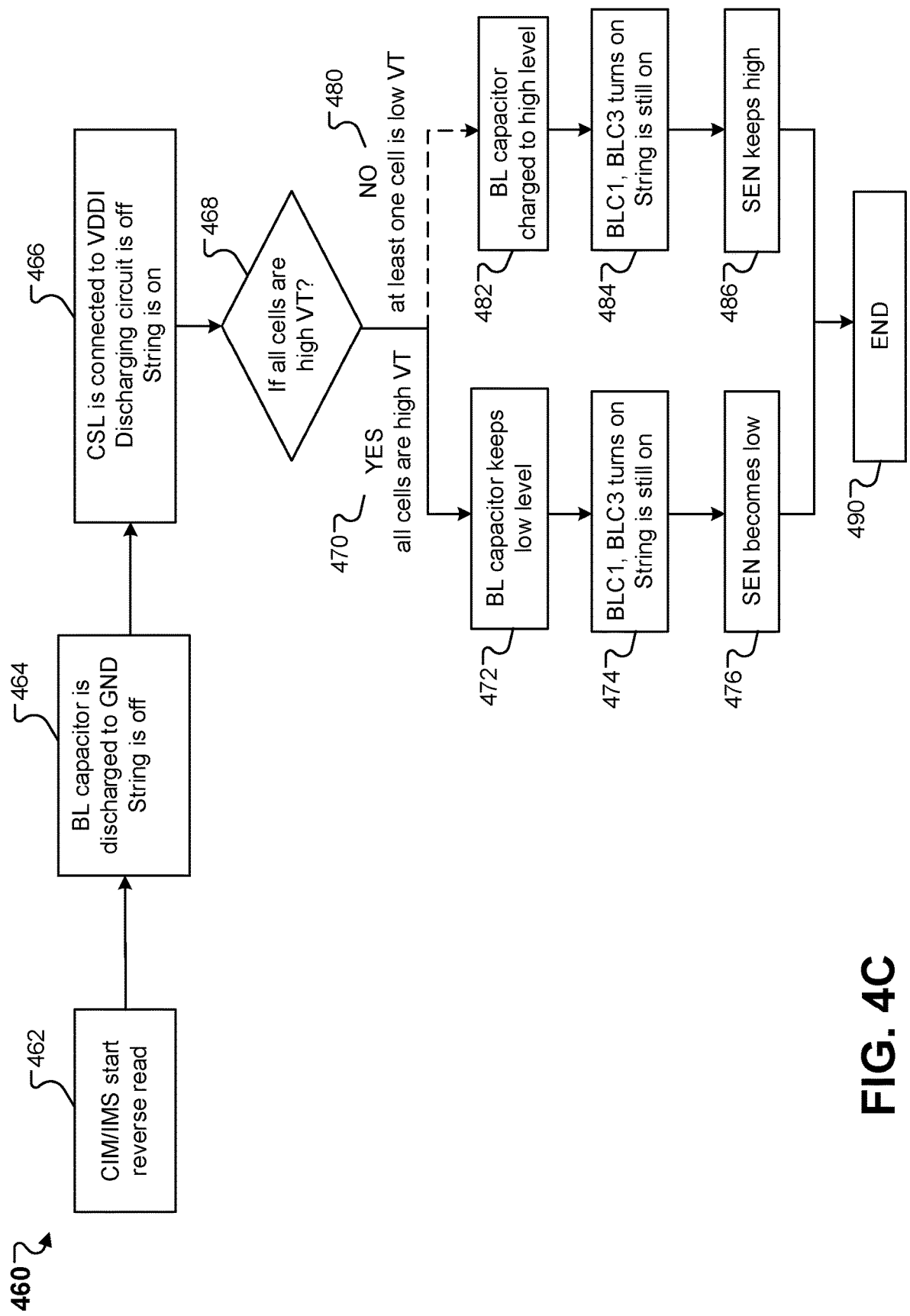
FIG. 4C is a flow chart of an example process for managing the multi-block operation using the reverse voltage read in the memory device of FIG. 4A, according to one or more implementations of the present disclosure.

FIG. 4C is a flow chart of an example process 460 for performing the multi-block operation using the reverse voltage read in the memory device 400 of FIG. 4A, according to one or more implementations of the present disclosure. The process 460 can be performed by the memory device 400 of FIG. 4A (e.g., the control logic of the memory device 400).

At 462, the memory device 400 receives a command, e.g., from a controller such as the device controller 112 or the host controller 122 of FIG. 1A. The command can include a multi-block operation for CIM or IMS. The command can also indicate to perform a reverse voltage read.

At 464, in the bit line setting phase 452, the strings 412 are off, and the discharging circuit 428 is turned on by turning on the discharging transistor with the control signal PRST to discharge the bit line capacitor 406 to a low voltage level, e.g., the ground.

At 466, in the bit line development phase 454, the strings 412 are turned on (e.g., by controlling the SSL and the GSL as shown in FIG. 4B), and the discharging circuit 428 is turned off, e.g., by turning off the discharging transistor with the control signals PRST. The CSL 407 can be coupled to the supply voltage VDDI. The sensing capacitor 436 can be charged to a high voltage level, e.g., by the precharging circuit 430, with the switch transistor 426 being turned off.

Whether a reverse current path, e.g., 411, can be formed, from the CSL 407 through the strings 412 to the bit line capacitor 406 depends on whether memory cells in the strings 412 have high threshold voltage Vt (468). If memory cells in all the strings 412 have a high threshold voltage Vt (470), the reverse current path cannot be formed and the bit line capacitor 406 keeps at a low voltage level. If a memory cell in at least one of the strings 412 has a low threshold voltage Vt (480), the reverse current path can be formed and the bit line capacitor 406 is charged to a high voltage level (482).

In the bit line sensing phase 456, at step 474 or step 484, the switch transistor 426 and the first transistor 422 are turned on by corresponding control signals BLC3 and BLC1 and the strings 412 can be still on, such that the sensing capacitor 436 is conductively coupled to the bit line capacitor 406, and a voltage level of the sensing capacitor 436 (or at the sensing node 435) can become correspond to a voltage level of the bit line capacitor 406 (or at node A 403). For example, if the bit line capacitor 406 keeps at a low voltage level (472), the sensing node 435 becomes to a low voltage level (476). If the bit line capacitor 406 is charged to a high voltage level (482), the sensing node 435 keeps at a high voltage level (486).

After the bit line sensing phase 456, the process 460 ends at step 490. The process 460 can further include latching a sensing result, e.g., "1" representing a high voltage level at the sensing node 435 or "0" representing a low voltage level at the sensing node 435, into a latch circuit coupled to the sensing node 435 in the page buffer.

Figure 4D:
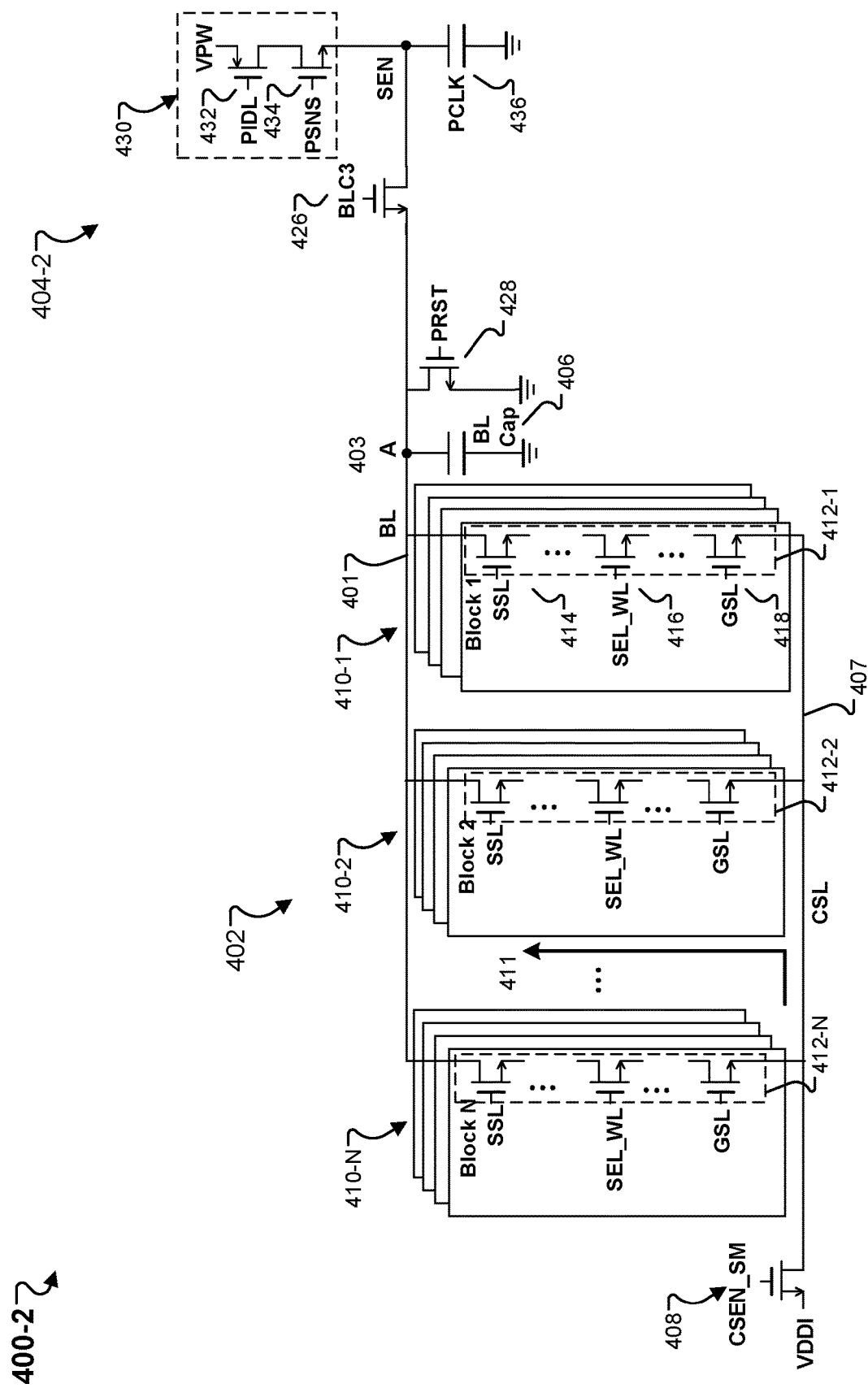
FIG. 4D is a schematic diagram illustrating another example of a memory device for performing a multi-block operation using reverse voltage read in the memory device, according to one or more implementations of the present disclosure.
Figure 4E:
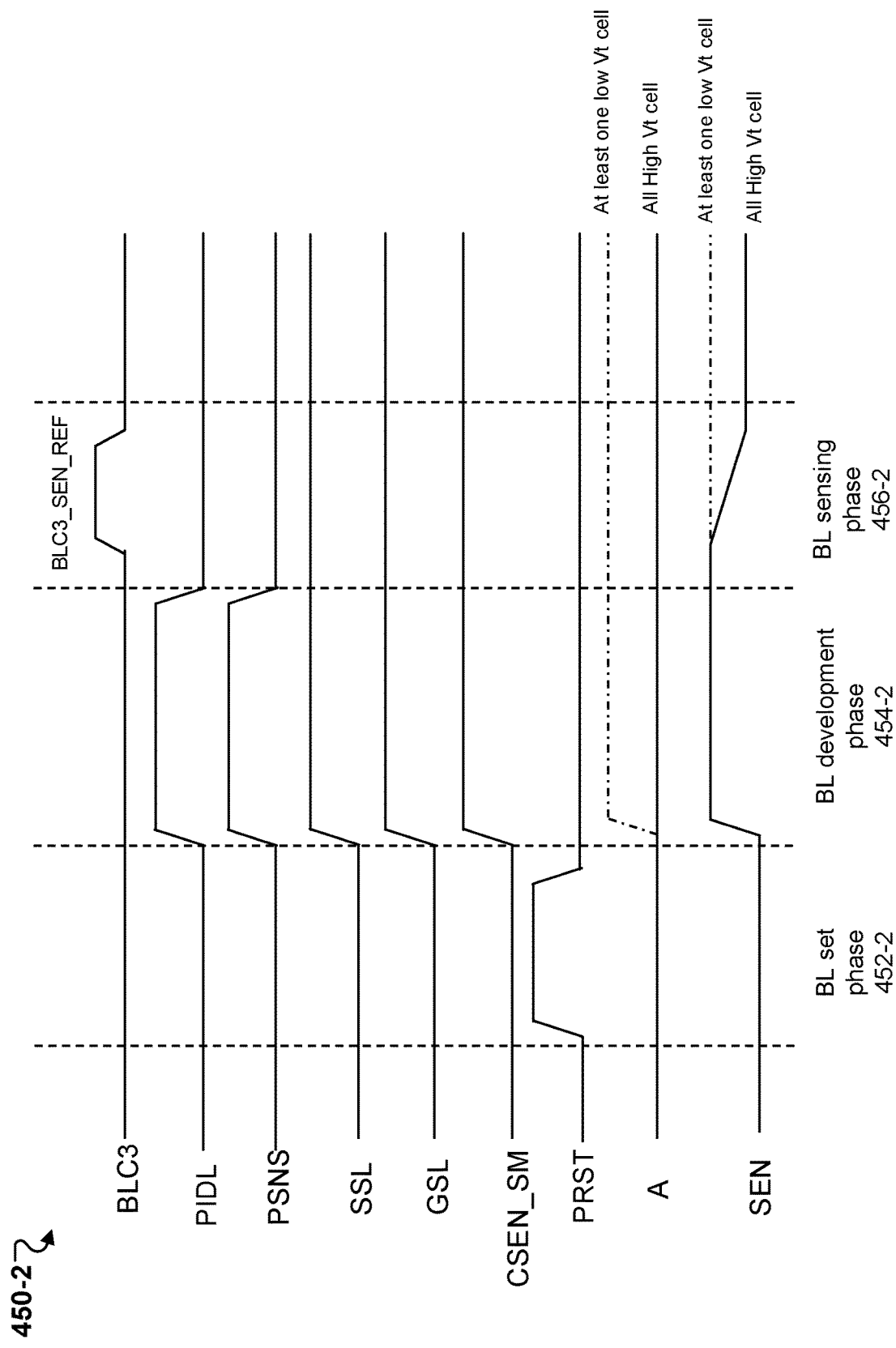
FIG. 4E shows a timing diagram illustrating voltage level changes at different nodes of the memory device of FIG. 4D during a series of operation phases, according to one or more implementations of the present disclosure.
Figure 4F:
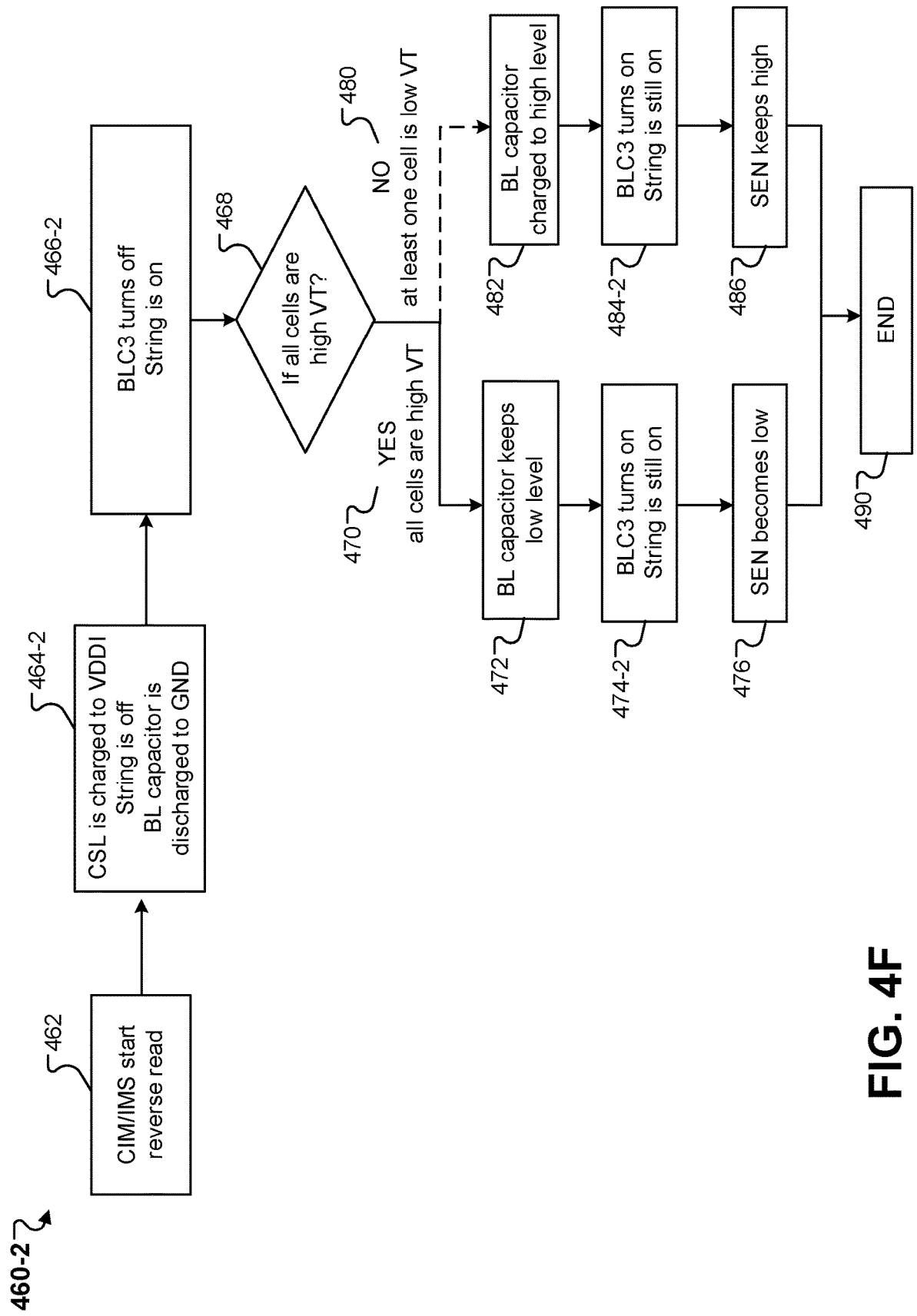
FIG. 4F is a flow chart of an example process for managing the multi-block operation using the reverse voltage read in the memory device of FIG. 4D, according to one or more implementations of the present disclosure.

FIG. 4D is a schematic diagram illustrating another example of a memory device 400-2 for performing a multi-block operation using reverse voltage read in the memory device 400-2, according to one or more implementations of the present disclosure. The memory device 400-2 can be the memory 116 of FIG. 1A or the memory device 200 of FIG. 2. FIG. 4E shows a timing diagram 450-2 illustrating voltage level changes at different nodes of the memory device 400-2 of FIG. 4D during a series of operation phases, according to one or more implementations of the present disclosure. FIG. 4F is a flow chart of an example process 460-2 for managing the multi-block operation using the reverse voltage read in the memory device 400-2 of FIG. 4D, according to one or more implementations of the present disclosure.

As illustrated in FIG. 4D, the memory device 400-2 is similar to the memory device 400, except that a circuitry 404-2 in the memory device 400-2 does not include the bit line control circuit 420 in the memory device 400, and the switch transistor 426 can be directly coupled to the bit line 401 and the bit line capacitor 406. As the reverse voltage read does not need to use the bit line control circuit 420 for precharging, the multi-block operation performed in the memory device 400-2 can be same as, or similar to, the multi-block operation performed in the memory device 400.

As illustrated in the timing diagram 450-2, the series of operation phases including a bit line setting phase (or an initial phase) 452-2, a bit line development phase 454-2, and a bit line sensing phase 456-2 can be same as, or similar to, the bit line setting phase 452, the bit line development phase 454, and the bit line sensing phase 456.

As shown in FIGS. 4E-4F, during the bit line setting phase 452-2, at step 464-2, the bit line capacitor 406 is first discharged by the discharging circuit 428 to a low voltage level, e.g., the ground. The discharging circuit 428 can be turned on by turning on the discharging transistor with the control signal PRST at a high voltage level. The strings 412 are turned off, e.g., by providing the SSL and GSL with a low voltage level. The CSL 407 can be disconnected from the supply voltage VDDI, e.g., by turning off the control transistor 408 with the control signal CSEN_SM at a low voltage level. The voltage level at node A 403 can be at a low voltage level after the bit line capacitor 406 is discharged.

During the bit line development phase 454-2 and at step 466-2, as shown in FIG. 4B, the discharging circuit 428 is turned off, e.g., by turning off the discharging transistor with the control signal PRST. The discharging circuit 428 can be turned off for the remaining phases of the multi-block operation. The strings 412 are turned on, e.g., by turning on the SSTs 414 with the SSL having a high voltage level, turning on the GSTs 418 with the GSL at a high voltage level, and applying a read voltage to a selected word line and a high voltage to other word lines. The control transistor 408 is turned on during the bit line development phase 454 (and the bit line sensing phase 456) by proving the control signal CSEN_SM at a high voltage level, such that the CSL 407 is conductively coupled to the supply voltage VDDI and is charged to have a high voltage level. In such a way, as shown in FIG. 4D, the reverse current path 311 can be formed from the CSL 407 coupled to the supply voltage VDDI through the strings 412 to the bit line 401 to charge the bit line capacitor 406 that is pre-discharged by the discharging circuit 428 in the bit line setting phase 452.

If all the memory cells in the strings 412 have a high threshold voltage Vt, the voltage level at the CSL 407 may be no greater than a voltage level of the strings 412 (or the threshold voltage level(s) of the memory cells) and thus there may be no current following from the CSL 407 to the strings 412 and then to the bit line capacitor 406. Accordingly, the bit line capacitor 406 may not be charged and the voltage level at node A may keep at a low voltage level, as shown in FIG. 4E. If a memory cell in at least one string 412 among the strings 412 has a low threshold voltage Vt, the voltage level at the CSL 407 can be greater than a voltage level of the at least one string 412, and thus a current flows, along the reverse current path 411, from the CSL 407 through the at least one string 412 to the bit line 401 and the bit line capacitor 406. Accordingly, the bit line capacitor 406 can be charged and the voltage level at node A may gradually increase to a high voltage level, as shown in FIG. 4E.

In some embodiments, the circuitry 404 can be configured to, in the bit line sensing phase 456-2, sense voltage threshold levels of memory cells in the strings 412 of the multiple blocks 410 by conductively connecting the bit line capacitor 406 (or the bit line 401) to the sensing capacitor 436 (or the sensing node 435) that is pre-charged.

The precharging circuit 430 can be configured to charge the sensing capacitor 436 before the bit line sensing phase 456-2. For example, as shown in FIG. 4E, during the bit line development phase 454-2, the precharging circuit 430 is turned on by turning on the first transistor 432 and the second transistor 434 with the corresponding control signals PIDL and PSNS at high voltage levels. The precharging circuit 430 can be turned off after the bit line development phase 454-2.

The switch transistor 426 is coupled between the bit line 401 and the sensing node 435. The switch transistor 426 can be configured to be turned off during the bit line charging phase 452-2 and the bit line development phase 454-2 and to be turned on only during the bit line sensing phase 456-2, e.g., as illustrated in FIG. 4E. In such a way, the sensing capacitor 436 can be pre-charged independently from the bit line capacitor 406 being pre-discharged during the bit line charging phase 452-2 and/or charged during the bit line development phase 454-2.

During the bit line sensing phase 456-2, at step 474-2 or step 484-2, the switch transistor 426 is turned on with the control signal BLC3 having a high voltage level (e.g., BLC3_SEN_REF), and the sensing capacitor 436 is conductively coupled to the bit line capacitor 406, the bit line 401, and the strings 412. The strings 412 can be turned on. The bit line capacitor 406 can have a substantially greater (e.g., one or more orders of magnitude) capacitance than the sensing capacitor 436, the bit line capacitor 406 and the sensing capacitor 436 can complete charge sharing in a short time period. Therefore, a voltage level at the sensing node 435 (e.g., the voltage level of the sensing capacitor 436) can become corresponding to a voltage level at node A 403 (e.g., the voltage level of the bit line capacitor 406), which can indicate a voltage level of the memory cells in the strings 412. For example, if the bit line capacitor 406 keeps at a low voltage level (472), the sensing node 435 becomes to a low voltage level (476). If the bit line capacitor 406 is charged to a high voltage level (482), the sensing node 435 keeps at a high voltage level (486).

After the bit line sensing phase 456-2, the process 460-2 ends at step 490. The process 460-2 can further include latching a sensing result, e.g., "1" representing a high voltage level at the sensing node 435 or "0" representing a low voltage level at the sensing node 435, into a latch circuit coupled to the sensing node 435 in the page buffer.

Example Process

Figure 5:
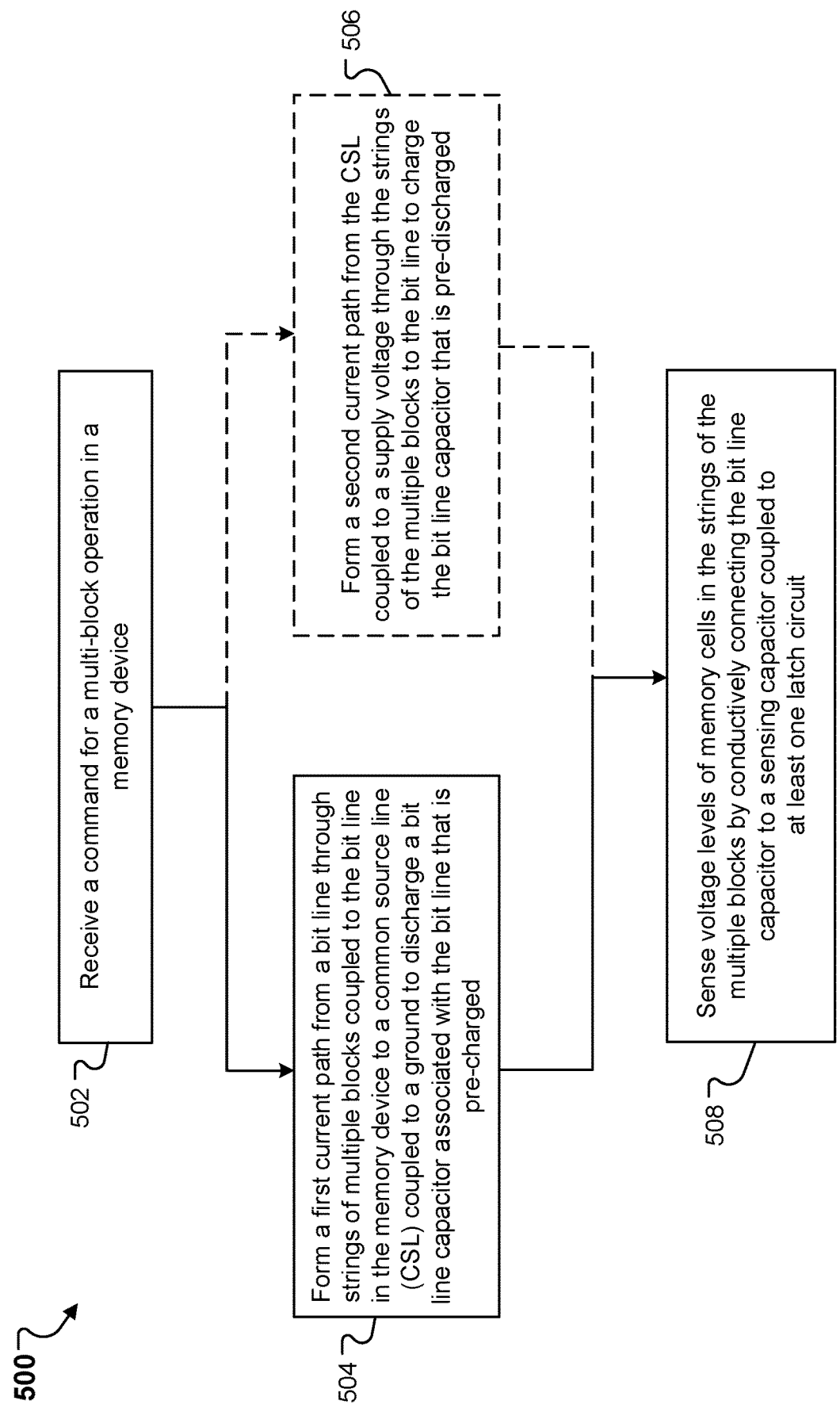
FIG. 5 is a flow chart of an example process for managing a multi-block operation in a memory device, according to one or more implementations of the present disclosure.

FIG. 5 is a flow chart of an example process 500 for managing a multi-block operation in a memory device, according to one or more implementations of the present disclosure. The memory device can be the memory 116 of FIG. 1, the memory device 200 of FIG. 2, the memory device 300 of FIG. 3A, the memory device 300-2 of FIG. 3D, the memory device 400 of FIG. 4A, or the memory device 400-2 of FIG. 4D.

In some embodiments, the memory device includes a memory cell array (e.g., the memory cell array 210 of FIG. 2, the memory cell array 302 of FIG. 3A or 3D, or the memory cell array 402 of FIG. 4A or 4D). The memory cell array can include a plurality of blocks (e.g., the block 140 of FIG. 1B, the block 150 of FIG. 1C, the block 310 of FIG. 3A or 3D, or the block 410 of FIG. 4A or 4D). The memory device can also include a plurality of bit lines coupled to the plurality of blocks. A bit line, e.g., the bit line 301 of FIG. 3A or 3D or the bit line 401 of FIG. 4A or 4D, is coupled to a respective string (e.g., the string 312 of FIG. 3A or 3D or the string 412 of FIG. 4A or 4D) in each of multiple blocks (e.g., the blocks 310 of FIG. 3A or 3D or the blocks 410 of FIG. 4A or 4D).

Each string can include a number of memory cells (e.g., the memory cells 141 of FIG. 1B, 157 of FIG. 1C, 316 of FIG. 3A or 3D, or 416 of FIG. 4A or 4D), a string select transistor (SST) (e.g., SST 314 of FIG. 3A or 3D or 414 of FIG. 4A or 4D), and a ground select transistor (GST) (e.g., GST 318 of FIG. 3A or 3D or 418 of FIG. 4A or 4D), which are all connected in series. The SST is coupled to a string select line (SSL) (e.g., SSL 146 of FIG. 1B or SSL 156 of FIG. 1C or SSL as described with reference to FIG. 3A-3C, or 3D-3F, or 4A-4C, or 4D-4F), and the GST is coupled to a ground select line (GSL) (e.g., GSL 148 of FIG. 1B or GSL 158 of FIG. 1C or GSL as described with reference to FIG. 3A-3C, or 3D-3F, or 4A-4C, or 4D-4F). Gates of the memory cells are respectively connected to word lines $WL_0$, $WL_1, \ldots, WL_{n-1}, WL_n$. A memory cell can be individually selected by a bit line and a word line (e.g., a selected word line SEL_WL). The strings in the multiple blocks 410 are connected to a common source line (CSL) (e.g., the CSL 307 of FIG. 3A-3C or 3D-3F or the CSL 407 of FIG. 4A-4C or 4D-4F) via the GSTs in the strings. The CSL can be coupled to a ground or a supply voltage VDDI.

The memory device can further include circuitry coupled to the memory cell array, the bit line, and the CSL. The circuitry can be the circuitry 304 of FIGS. 3A-3C, the circuitry 304-2 of FIG. 3D-3F, or the circuitry 404 of FIG. 4A-4C or the circuitry 404-2 of FIG. 4D-4F. The memory device can include a control logic (e.g., the control logic 204 of FIG. 2). The circuitry can include at least part of the control logic and be configured to provide control signals to respective components in the memory device. The process 500 can be performed by the memory device, e.g., the circuitry and/or the control logic.

At 502, a command is received, e.g., through an interface such as the interface 202 of FIG. 2, for a multi-block operation in the memory device. The multi-block operation can include a computer-in-memory (CIM) operation or an in-computer-searching (IMS) operation. The command can indicate to perform a forward voltage read (e.g., as described with respect to FIGS. 3A-3C or FIG. 3D-3F) or a reverse voltage read (e.g., as described with respect to FIGS. 4A-4C or FIGS. 4D-4F).

If the command indicates to perform the forward voltage read, at 504, a first current path (e.g., a forward current path) from the bit line through strings of the multiple blocks coupled to the bit line to the CSL coupled to the ground is formed to discharge a capacitor associated with the bit line that is pre-charged. The forward current path can be the forward current path 311 illustrated in FIG. 3A or 3D. The capacitor can be the bit line capacitor 306 of FIG. 3A or 3D. The capacitor can include a parasitic capacitor formed between the bit line and at least one adjacent bit line. The forward voltage read can be performed according to the process 360 as described in FIG. 3C or the process 360-2 as described in FIG. 3F.

In some embodiments, as illustrated in FIGS. 3B-3C or FIGS. 3E-3F, the forward voltage read includes three operation phases: a bit line charging phase (e.g., 352 of FIG. 3B or 352-2 of FIG. 3E), a bit line development phase (e.g., 354 of FIG. 3B or 354-2 of FIG. 3E), and a bit line sensing phase (e.g., 356 of FIG. 3B or 356-2 of FIG. 3E). In the bit line charging phase, the circuitry is configured to turn on a charging path to charge the capacitor associated with the bit line while the strings coupled to the bit line are off.

In some embodiments, the circuitry includes a control circuit (e.g., the bit line control circuit 320 of FIG. 3A) having a first end coupled to a supply voltage (VDDI) and a second end coupled to the bit line. The capacitor is charged through the charging path by turning on the control circuit to conductively connect the supply voltage to the bit line. In some embodiments, the control circuit includes a first transistor (e.g., the first transistor 322 of FIG. 3A) coupled to the bit line and a second transistor coupled between the supply voltage and the first transistor. The first transistor and the second transistor can be configured to be turned on to charge the capacitor in the bit line charging phase. During the bit line charging phase, a first control signal for the first transistor can have a lower voltage level than a second control signal for the second transistor, such that a current flows from the supply voltage to the capacitor for charging.

During the bit line development phase, the control circuit is turned off, e.g., by turning off the first transistor and the second transistor. The strings are turned on, e.g., by providing a high voltage level for the SSL and GSL and providing a read voltage to a selected word line and a high voltage to one or more other word lines. The strings are conductively coupled the CSL that is conductively coupled to the ground while the strings are turned on. In such a way, the forward current path from the bit line through the strings of the multiple blocks coupled to the bit line to the CSL coupled to the ground can be formed to discharge the pre-charged capacitor.

During the bit line sensing phase, as illustrated in FIGS. 3B and 3C, voltage threshold levels of memory cells in the strings are sensed by conductively connecting the capacitor to a sensing capacitor (e.g., the sensing capacitor 336 of FIG. 3A) that is coupled to at least one latch circuit (508). In some embodiments, the sensing capacitor includes at least one of a transistor capacitor or a parasitic capacitor associated with the at least one latch circuit.

The sensing capacitor can be configured to be precharged to a first voltage level before the capacitor is conductively connected to the sensing capacitor. In some embodiments, the circuitry includes a precharging circuit (e.g., the precharging circuit 330 of FIG. 3A) having a first end coupled to the supply voltage and a second end coupled to the sensing capacitor, and a switch transistor (e.g., the switch transistor 326 of FIG. 3A) coupled between the bit line and the precharging circuit. The sensing capacitor can be precharged by turning on the precharging circuit to conductively connect the supply voltage to the sensing capacitor, with the switch transistor being turned off. The switch transistor can be configured to be turned on to conductively connect the capacitor to the sensing capacitor. In some embodiments, the first transistor is coupled between the switch transistor and the bit line, and the first transistor and the switch transistor can be configured to be turned on to conductively connect the capacitor to the sensing capacitor to detect the voltage level of the discharged capacitor in the bit line sensing phase. The second transistor is configured to be turned off in the bit line sensing phase and the bit line development phase. During the bit line sensing phase, the first control signal for the first transistor can have a lower voltage level than a third control signal for the third transistor, such that a current still flows along the first current path.

In some embodiments, a capacitance of the capacitor is substantially greater than a capacitance of the sensing capacitor, such that a voltage level of the sensing capacitor becomes corresponding to the voltage level of the discharged capacitor when the capacitor is conductively connected to the sensing capacitor. The charge sharing between the capacitor and the sensing capacitor can occur in a short time period. As illustrated in FIGS. 3B and 3C, the sensing capacitor is configured to: keep at the first voltage level if the voltage threshold levels of the memory cells in the strings of the multiple blocks are at a higher level, and decrease to a second voltage level if a voltage threshold level of memory cells in at least one of the strings of the multiple blocks is at a lower level, the second voltage level being lower than the first voltage level.

In some embodiments, e.g., as illustrated in FIGS. 3D-3F, the circuitry (e.g., the circuitry 304-2 of FIG. 4D) does not include the control circuit, and the switch transistor is directly coupled to the bit line and the bit line capacitor. The bit line capacitor can be charged during a bit line charging phase (e.g., 452-2 of FIG. 3E) by turning on the switch transistor and the precharging circuit. The precharging circuit can be turned on by turning on the first transistor and the second transistor in the precharging circuit with corresponding control signals (e.g., PIDL and PSNS) at high voltage levels, e.g., as illustrated in FIG. 3E.

With continued reference to FIG. 5, if the command indicates to perform the reverse voltage read, at 506, a second current path (e.g., a reverse current path) from the CSL coupled to the supply voltage through the strings of the multiple blocks to the bit line is formed to charge the capacitor that is pre-discharged. The second current path can be the reverse current path 411 of FIG. 4A or 4D. The capacitor can be the bit line capacitor 406 of FIG. 4A or 4D. The capacitor can include a parasitic capacitor formed between the bit line and at least one adjacent bit line. The reverse voltage read can be performed according to the process 460 as described in FIG. 4C or the process 460-2 as described in FIG. 4F.

In some embodiments, as illustrated in FIGS. 4B-4C or FIGS. 4E-4F, the reverse voltage read includes three operation phases: a bit line setting phase (e.g., 452 of FIG. 4B or 452-2 of FIG. 4E), a bit line development phase (e.g., 454 of FIG. 4B or 454-2 of FIG. 4E), and a bit line sensing phase (e.g., 456 of FIG. 4B or 456-2 of FIG. 4E). In the bit line setting phase, the circuitry is configured to discharge the capacitor to a first voltage level (e.g., the ground) while the strings coupled to the bit line are off.

In some embodiments, the circuitry includes a discharging circuit (e.g., the discharging circuit 428 of FIG. 4A or 4D) having a first end coupled to the ground and a second end coupled to the bit line. The capacitor is discharged by turning on the discharging circuit to conductively connect the bit line to the ground.

During the bit line development phase, the discharging circuit is turned off, and the strings are turned on. The strings are conductively coupled the CSL that is conductively coupled to the supply voltage, e.g., by turning on a control transistor (e.g., the control transistor 408 of FIG. 4A or 4D). The CSL coupled to the supply voltage can have a second voltage level higher than the first voltage level of the discharged capacitor. In such a way, the reverse current path from the CSL coupled to the supply voltage through the strings of the multiple blocks to the bit line can be formed to charge the pre-discharged capacitor.

During the bit line sensing phase, as illustrated in FIGS. 4B and 4C or FIGS. 4E and 4F, voltage threshold levels of memory cells in the strings are sensed by conductively connecting the capacitor to a sensing capacitor (e.g., the sensing capacitor 436 of FIG. 4A or 4D) that is coupled to at least one latch circuit, which can be similar to what is described at step 508.

The sensing capacitor can be configured to be precharged to a third voltage level before the capacitor is conductively connected to the sensing capacitor. In some embodiments, the circuitry includes a precharging circuit (e.g., the precharging circuit 430 of FIG. 4A or 4D) having a first end coupled to the supply voltage and a second end coupled to the sensing capacitor, and a switch transistor (e.g., the switch transistor 426 of FIG. 4A or 4D) coupled between the bit line and the precharging circuit. The sensing capacitor can be precharged by turning on the precharging circuit to conductively connect the supply voltage to the sensing capacitor, with the switch transistor being turned off. The switch transistor can be configured to be turned on to conductively connect the capacitor to the sensing capacitor. In some embodiments, the first transistor is coupled between the switch transistor and the bit line, and the first transistor and the switch transistor can be configured to be turned on to conductively connect the capacitor to the sensing capacitor to detect the voltage level of the discharged capacitor in the bit line sensing phase.

In some embodiments, as illustrated in FIGS. 4B and 4C or FIGS. 4E and 4F, the sensing capacitor is configured to keep at the third voltage level if a voltage threshold level of memory cells in at least one of the strings of the multiple blocks is at a lower level, and decrease to a fourth voltage level if the voltage threshold levels of the memory cells in the strings of the multiple blocks is at a higher level, the fourth voltage level being lower than the third voltage level.

In some embodiments, the process 500 further include: latching a sensing result, e.g., "1" representing a high voltage level at a sensing node coupled to the sensing capacitor or "0" representing a low voltage level at the sensing node, into a latch circuit coupled to the sensing node in a page buffer (e.g., the page buffer 222 of FIG. 2).

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    a memory cell array comprising at least two blocks each having a plurality of memory cells;
    a bit line, wherein each of the at least two blocks comprises a string of memory cells coupled to the bit line; and
    a circuitry coupled to the memory cell array and the bit line,
    wherein the circuitry is configured to:
        turn on a charging path to charge a capacitor associated with the bit line while strings coupled to the bit line in the at least two blocks are off,
        turn off the charging path and turn on the strings to discharge the capacitor, and
        sense voltage threshold levels of memory cells in the strings by detecting a voltage level of the discharged capacitor, with the strings being on and the charging path being off, and
    wherein the circuitry is configured to:
        in response to receiving a command to perform a multi-block operation in the memory cell array, turn on the charging path to charge the capacitor associated with the bit line.

2. The memory device of claim 1, wherein the circuitry is configured to detect the voltage level of the discharged capacitor by conductively connecting the capacitor to a sensing capacitor coupled to at least one latch circuit.

3. The memory device of claim 2, wherein the sensing capacitor is configured to be precharged to a first voltage level before the capacitor is conductively connected to the sensing capacitor, and
    wherein the sensing capacitor is configured to:
        keep at the first voltage level if the voltage threshold levels of the memory cells in the strings are at a higher level, and
        decrease to a second voltage level if a voltage threshold level of memory cells in at least one of the strings is at a lower level, the second voltage level being lower than the first voltage level.

4. The memory device of claim 2, wherein a capacitance of the capacitor is substantially greater than a capacitance of the sensing capacitor, such that a voltage level of the sensing capacitor becomes corresponding to the voltage level of the discharged capacitor when the capacitor is conductively connected to the sensing capacitor.

5. The memory device of claim 2, wherein the circuitry comprises:
    a control circuit having a first end coupled to a supply voltage and a second end coupled to the bit line,
    a precharging circuit having a third end coupled to the supply voltage and a fourth end coupled to the sensing capacitor, and
    a switch transistor coupled between the bit line and the precharging circuit,
    wherein the capacitor is charged through the charging path by turning on the control circuit to conductively connect the supply voltage to the bit line,
    wherein the sensing capacitor is precharged by turning on the precharging circuit to conductively connect the supply voltage to the sensing capacitor, with the switch transistor being turned off, and
    wherein the switch transistor is configured to be turned on to conductively connect the capacitor to the sensing capacitor.

6. The memory device of claim 5, wherein the control circuit comprises:
    a first transistor coupled between the switch transistor and the bit line, and
    a second transistor coupled between the supply voltage and the first transistor,
    wherein the first transistor and the second transistor are configured to be turned on to charge the capacitor in a first phase and to be turned off while the capacitor is discharged in a second phase sequential to the first phase, and
    wherein the first transistor and the switch transistor are configured to be turned on to conductively connect the capacitor to the sensing capacitor to detect the voltage level of the discharged capacitor in a third phase sequential to the second phase, and wherein the second transistor is configured to be turned off in the third phase.

7. The memory device of claim 2, wherein the circuitry comprises:
    a precharging circuit having a first end coupled to a supply voltage and a second end coupled to the sensing capacitor, and
    a switch transistor coupled between the bit line and the precharging circuit,
    wherein the switch transistor and the precharging circuit are configured to be turned on to charge the capacitor and the sensing capacitor in a first phase,
    wherein the switch transistor is configured to be turned off while the capacitor is discharged and the sensing capacitor keeps being charged by the precharging circuit in a second phase sequential to the first phase, and
    wherein the switch transistor is configured to be turned on to conductively connect the capacitor to the sensing capacitor to detect the voltage level of the discharged capacitor in a third phase sequential to the second phase.

8. The memory device of claim 1, wherein the capacitor comprises a parasitic capacitor formed between the bit line and at least one adjacent bit line.

9. The memory device of claim 1, wherein the strings are conductively coupled to a common source line (CSL) that is conductively coupled to a ground while the strings are turned on.

10. A memory device comprising:
a memory cell array comprising at least two blocks each having a plurality of memory cells;
a bit line, wherein each of the at least two blocks comprises a string of memory cells coupled to the bit line;
a common source line (CSL) conductively coupled to strings coupled to the bit line in the at least two blocks; and
a circuitry coupled to the bit line and the CSL configured to:
turn off the strings and discharge a capacitor associated with the bit line to a first voltage level,
conductively connect the CSL to a supply voltage such that the CSL is charged to be at a second voltage level that is higher than the first voltage level,
turn on the strings to conductively connect the CSL to the bit line to charge the capacitor, and
sense voltage threshold levels of memory cells in the strings by detecting a voltage level of the charged capacitor, with the strings being on and the CSL being at the second voltage level,
wherein the circuitry is configured to:
in response to receiving a command to perform a multi-block operation in the memory cell array, conductively connect the CSL to the supply voltage and turn on the strings coupled to the bit line to conductively connect the CSL to the bit line to charge the capacitor.

11. The memory device of claim 10, wherein the circuitry is configured to detect the voltage level of the charged capacitor by conductively connecting the capacitor to a sensing capacitor coupled to at least one latch circuit.

12. The memory device of claim 11, wherein the sensing capacitor is configured to be precharged to a third voltage level before the capacitor is conductively connected to the sensing capacitor, the third voltage level being higher than the first voltage level, and
wherein the sensing capacitor is configured to:
keep at the third voltage level if a voltage threshold level of memory cells in at least one of the strings is at a lower level, and
decrease to a fourth voltage level if the voltage threshold levels of the memory cells in the strings is at a higher level, the fourth voltage level being lower than the third voltage level.

13. The memory device of claim 11, wherein a capacitance of the capacitor is substantially larger than a capacitance of the sensing capacitor, such that a voltage level of the sensing capacitor becomes corresponding to the voltage level of the charged capacitor after the capacitor is conductively connected to the sensing capacitor.

14. The memory device of claim 11, wherein the circuitry comprises:
a discharging circuit having a first end coupled to a ground and a second end coupled to the bit line,
a precharging circuit having a third end coupled to the supply voltage and a fourth end coupled to the sensing capacitor, and
a switch transistor coupled between the bit line and the precharging circuit,
wherein the capacitor is discharged by turning on the discharging circuit to conductively connect the bit line to the ground,
wherein the sensing capacitor is precharged by turning on the precharging circuit to conductively connect the supply voltage to the sensing capacitor, with the switch transistor being off, and
wherein the switch transistor is configured to be turned on to conductively connect the capacitor to the sensing capacitor.

15. The memory device of claim 10, wherein the circuitry comprises a control transistor having a first terminal coupled to the supply voltage and a second terminal coupled to the CSL, and the control transistor is configured to be turned on to conductively connect the CSL to the supply voltage.

16. A memory device comprising:
a memory cell array comprising at least two blocks each having a plurality of memory cells;
a bit line, wherein each of the at least two blocks comprises a string of memory cells coupled to the bit line;
a common source line (CSL) coupled to strings coupled to the bit line in the at least two blocks; and
a circuitry coupled to the memory cell array, the bit line, and the CSL,
wherein the circuitry is configured to perform a multi-block operation in the memory cell array by at least one of:
forming a first current path from the bit line through the strings of the at least two blocks to the CSL coupled to a ground to discharge a capacitor associated with the bit line that is pre-charged, or
forming a second current path from the CSL coupled to a supply voltage through the strings of the at least two blocks to the bit line to charge the capacitor that is pre-discharged.

17. The memory device of claim 16, wherein the circuitry comprises at least one of: a control circuit having a first end coupled to the supply voltage and a second end coupled to the bit line, the control circuit being configured to pre-charge the capacitor before the first current path is formed, or
a discharging circuit having a first end coupled to the ground and a second end coupled to the bit line, the discharging circuit being configured to pre-discharge the capacitor before the second current path is formed.

18. The memory device of claim 16, wherein the circuitry is configured to:
sense voltage threshold levels of memory cells in the strings of the at least two blocks by conductively connecting the capacitor to a sensing capacitor that is coupled to at least one latch circuit.

19. The memory device of claim 18, wherein the circuitry further comprises:
a precharging circuit having a first end coupled to the supply voltage and a second end coupled to the sensing capacitor, the precharging circuit being configured to pre-charge the sensing capacitor before conductively connecting the capacitor to the sensing capacitor, and
a switch transistor coupled between the bit line and the precharging circuit and configured to be turned on to conductively connect the capacitor to the sensing capacitor.

* * * * *